(12) United States Patent
Valverde et al.

(10) Patent No.: US 11,721,463 B2
(45) Date of Patent: Aug. 8, 2023

(54) ELECTRO-PERMANENT-MAGNET-BASED FORCE PROFILE FOR AN INPUT ELEMENT ON AN INPUT DEVICE

(71) Applicant: Logitech Europe S.A., Lausanne (CH)

(72) Inventors: Nuno Miguel Pereira dos Anjos Valverde, Bandon (IE); Jan Stoeckli, Vaud (CH); Kevin Forde, Cork City (IE); Artur Miller, Cork City (IE)

(73) Assignee: Logitech Europe S.A., Lausanne (CH)

( * ) Notice: Subject to any disclaimer, the term of this patent is extended or adjusted under 35 U.S.C. 154(b) by 0 days.

(21) Appl. No.: 17/553,549

(22) Filed: Dec. 16, 2021

(65) Prior Publication Data
US 2023/0197323 A1    Jun. 22, 2023

(51) Int. Cl.
| | | |
|---|---|---|
| *H01F 7/04* | (2006.01) | |
| *H01F 7/02* | (2006.01) | |
| *H01F 13/00* | (2006.01) | |
| *G01R 33/07* | (2006.01) | |

(52) U.S. Cl.
CPC ......... *H01F 7/0294* (2013.01); *G01R 33/072* (2013.01); *H01F 7/0252* (2013.01); *H01F 7/04* (2013.01); *H01F 13/003* (2013.01)

(58) Field of Classification Search
CPC ................................ H01F 7/0252; H01F 7/04
See application file for complete search history.

(56) References Cited

U.S. PATENT DOCUMENTS

| | | | |
|---|---|---|---|
| 10,797,699 B1* | 10/2020 | Morrison | H01H 36/004 |
| 2020/0357584 A1* | 11/2020 | Morrison | H01H 36/0073 |
| 2020/0358438 A1* | 11/2020 | Casparian | H01F 7/0273 |

* cited by examiner

*Primary Examiner* — Ramon M Barrera
(74) *Attorney, Agent, or Firm* — Kilpatrick Townsend & Stockton LLP

(57) ABSTRACT

An input device comprising a processor(s), an input element, an electropermanent magnet (EPM) assembly including: a permanent magnet operable to generate a magnetic field; and a magnetizing assembly configured to set a magnetic field generated by the permanent magnet, a first ferromagnetic element, and a second ferromagnetic element. The first ferromagnetic element is configured to part and move away from the second ferromagnetic element as the input element is depressed. When the EPM assembly magnetizes the permanent magnet to a first polarity, the first and second ferromagnetic elements are magnetically attracted to each other and provide an attracting that magnetically opposes the first and second ferromagnetic elements from parting, and when the EPM assembly magnetizes the permanent magnet to a second polarity, the first and second ferromagnetic elements are not magnetically attracted to each other and do not magnetically oppose the first and second ferromagnetic elements from parting.

17 Claims, 14 Drawing Sheets

ELECTRO-PERMANENT-MAGNET-BASED FORCE PROFILE FOR AN INPUT ELEMENT ON AN INPUT DEVICE

BACKGROUND

Input devices are commonplace in modern society and are typically used to convert human-induced analog inputs (e.g., touches, clicks, motions, touch gestures, button presses, scroll wheel rotations, etc.) made in conjunction with an input device into digital signals for computer processing. An input device can include any device that can provide data and control signals to a computing system. Some non-limiting examples of input devices include computer mice, keyboards, virtual reality and/or augmented reality controllers, touch pads, remote controls, gaming controllers, joysticks, trackballs, and the like. Some non-limiting examples of computing systems include desktop computers, laptop computers, netbook computers, gaming consoles, tablets and "phablet" computers, smart phones, personal digital assistants, wearable devices (e.g., smart watches, glasses), virtual reality (VR) and/or augmented reality (AR) headsets and systems, internet-of-things (IoT) devices, and the like.

Input devices have undergone many marked improvements over the last several decades. For instance, input elements (e.g., buttons, keys) of many ubiquitous input devices (e.g., keyboards, computer mice) have improved in ergonomics, performance, and user experience (UX). One aspect of performance includes a mechanical force feedback profile, which corresponds to how a key feels to the user as it is depressed over a range of motion. Some common types of force feedback profiles include tactile, clicky, and linear, among others. There are a number of mechanical methods and systems to achieve various desired force feedback profiles in keyboards and related input devices.

Similarly in computer mice, many advancements have improved performance, ergonomics, and UX, with particular mechanical improvements in input element operation and consistency. For example, Logitech® has developed highly tuned, premium key plate-based input elements that provide balanced, consistent, high performance actuation via their patented unique key plate design (U.S. Pat. No. 9,939,927).

Despite the many improvements in the various mechanically-based input elements, mechanical implementations are inherently subject to wear-and-tear over long term use and manufacturing tolerances that can detrimentally affect performance characteristics between identical models, particularly for lower quality input devices. Furthermore, while some contemporary input devices allow for the mechanical adjustment of certain performance characteristics of input elements, such as swapping out key switches (e.g., Cherry® MX keys) in keyboard devices, or adjusting springs or other biasing mechanisms in computer mice, which can change a force feedback profile of these devices (e.g., the way an input element feels to a user when the input element is depressed), these types of adjustments are often limited in scope and are also subject to wear-and-tear, limited accuracy, and other deleterious performance tradeoffs. Better solutions for customizing input elements in input devices and computer peripheral devices in general are needed.

Unless otherwise indicated herein, the materials described in this section are not prior art to the claims in this application and are not admitted to be prior art by inclusion in this section.

BRIEF SUMMARY

In certain embodiments, an input device comprises one or more processors, a mechanically depressible input element, and an electropermanent magnet (EPM) assembly including a permanent magnet operable to generate a magnetic field and a magnetizing assembly controlled by the one or more processors and configured to set a strength and polarity of the magnetic field generated by the permanent magnet, a first ferromagnetic element coupled to the depressible input element, and a second ferromagnetic element coupled to the EPM assembly. In some cases, the first and second ferromagnetic elements are configured to be at least partially axially aligned and in contact with each other when the depressible input element is in a neutral, non-depressed state; the first ferromagnetic element is configured to part and move away from the second ferromagnetic element as the depressible input element is depressed; when the EPM assembly magnetizes the permanent magnet to a first polarity, the first and second ferromagnetic elements are magnetically attracted to each other and provide an attracting force in proportion to the strength of the magnetic field that magnetically opposes the first and second ferromagnetic elements from parting; and wherein when the EPM assembly magnetizes the permanent magnet to a second polarity, the first and second ferromagnetic elements are not magnetically attracted to each other and do not magnetically oppose the first and second ferromagnetic elements from parting.

In some embodiments, the input element is flexible and provides a resistance to flexion, and when the EPM assembly magnetizes the permanent magnet to the first polarity and the strength of the magnetic field is greater than the resistance to flexion of the input element, a force imparted on the input element that causes the first and second ferromagnetic elements to part includes a force magnitude greater than the resistance to flexion and the attracting force of the first and second ferromagnetic elements. In some embodiments, the input element is flexible up to a threshold deflection distance and the input element is depressible up to a threshold depression distance, the threshold deflection distance being less than the threshold depression distance, and when the EPM assembly magnetizes the permanent magnet to the first polarity and the strength of the magnetic field is greater than the resistance to flexion of the input element, the input element is depressible up to the threshold deflection and stops until the force imparted on the input element is greater than the attracting force thereby causing the first and second ferromagnetic elements to part and cause the input element to continue depressing up to the threshold depression distance. In some cases, the first and second plates are configured to move apart up to 0.2 mm to 0.5 mm. The threshold depression distance for the input element is 0.5 mm to 0.7 mm, though other ranges are possible. In some embodiments, the input element is a key plate that includes: a front user-accessible portion having a top surface and a bottom surface; a pivot support portion; a rear portion including a bottom surface; and a shaft disposed in the pivot support portion, wherein the key plate rotates with respect to the shaft.

In certain embodiments, the EPM assembly, first ferromagnetic element, and second ferromagnetic element are configured on the rear portion of the key plate or on the front user-accessible portion of the key plate. Some embodiments may employ a Hall Effect Sensor configured to detect a change in a magnetic flux of the magnetic field of the EPM assembly, where the one or more processors are further configured to generate a control signal corresponding to a depression of the input element by a threshold distance when the magnetic flux changes by a threshold amount. In certain implementations, the input device is a computer mouse or a keyboard device. In some cases, the magnetizing assembly includes a magnetic core and polarization coil. In some cases, when the EPM assembly magnetizes the permanent magnet to the first polarity, a first magnetic circuit is formed that passes through at least the first or second ferromagnetic elements, and when the EPM assembly magnetizes the permanent magnet to the second polarity, a second magnetic circuit is formed within the EPM assembly that does not pass through the first and second ferromagnetic elements. In certain embodiments, when the EPM assembly magnetizes the permanent magnet to the first polarity, the magnetizing assembly and permanent magnet have matching magnetic poles, and when the EPM assembly magnetizes the permanent magnet to the second polarity, the magnetizing assembly and permanent magnet have opposing magnetic poles that form a closed magnetic circuit within the EPM assembly.

In some embodiments, a computer-implemented method comprises: receiving, by one or more processors, input data indicating a selection of one of a plurality of modes of operation of an input device, wherein the input device includes: an input element; an EPM assembly comprising: a permanent magnet operable to generate a magnetic field; a magnetizing assembly configured to set a strength and polarity of the magnetic field generated by the permanent magnet; a first ferromagnetic element coupled to the input element; and a second ferromagnetic element coupled to the EPM assembly, wherein the first and second ferromagnetic elements are configured to be at least partially axially aligned and in contact with each other when the input element is in a neutral, non-depressed state, and wherein the first ferromagnetic element is configured to part and move away from the second ferromagnetic element as the input element is depressed. The computer-implemented method can further include: in response to the received input data corresponding to the selection of a first mode of operation of the plurality of modes of operation: magnetizing the permanent magnet to a first polarity such that the first and second ferromagnetic elements are magnetically attracted to each other and provide an attracting force in proportion to the strength of the magnetic field that magnetically opposes the first and second ferromagnetic elements from parting; and in response to the received input data corresponding to the selection of a second mode of operation of the plurality of modes of operation: magnetizing the permanent magnet to a second polarity such that the first and second ferromagnetic elements are not magnetically attracted to each other and do not magnetically oppose the first and second ferromagnetic elements from parting.

In some embodiments, the input element is flexible and provides a resistance to flexion, and when the EPM assembly magnetizes the permanent magnet to the first polarity and the strength of the magnetic field is greater than the resistance to flexion of the depressible element, a force imparted on the input element that causes the first and second ferromagnetic elements to part includes a force magnitude greater than the resistance to flexion and the attracting force of the first and second ferromagnetic elements. In some aspects, the input element is flexible up to a threshold deflection distance, wherein the input element is depressible up to a threshold depression distance, the threshold deflection distance being less than the threshold depression distance, and wherein when the EPM assembly magnetizes the permanent magnet to the first polarity and the strength of the magnetic field is greater than the resistance to flexion of the depressible element, the input element is depressible up to the threshold deflection and stops until the force imparted on the input element is greater than the attracting force thereby causing the first and second ferromagnetic elements to part and cause the depressible element to continue depressing up to the threshold depression distance. In some cases, the input element is a key plate that includes: a front user-accessible portion having a top surface and a bottom surface; a pivot support portion; a rear portion including a bottom surface; and a shaft disposed in the pivot support portion, wherein the key plate rotates with respect to the shaft. In certain embodiments, the EPM assembly, first ferromagnetic element, and second ferromagnetic element are configured on the rear portion of the key plate or on the front user-accessible portion of the key plate. In some embodiments, the input device is a computer mouse or a keyboard key.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention will be more apparent from the following detailed description taken in conjunction with the accompanying drawings, in which.

Throughout the drawings, it should be noted that like reference numbers are typically used to depict the same or similar elements, features, and structures.

DETAILED DESCRIPTION

Figure 1:
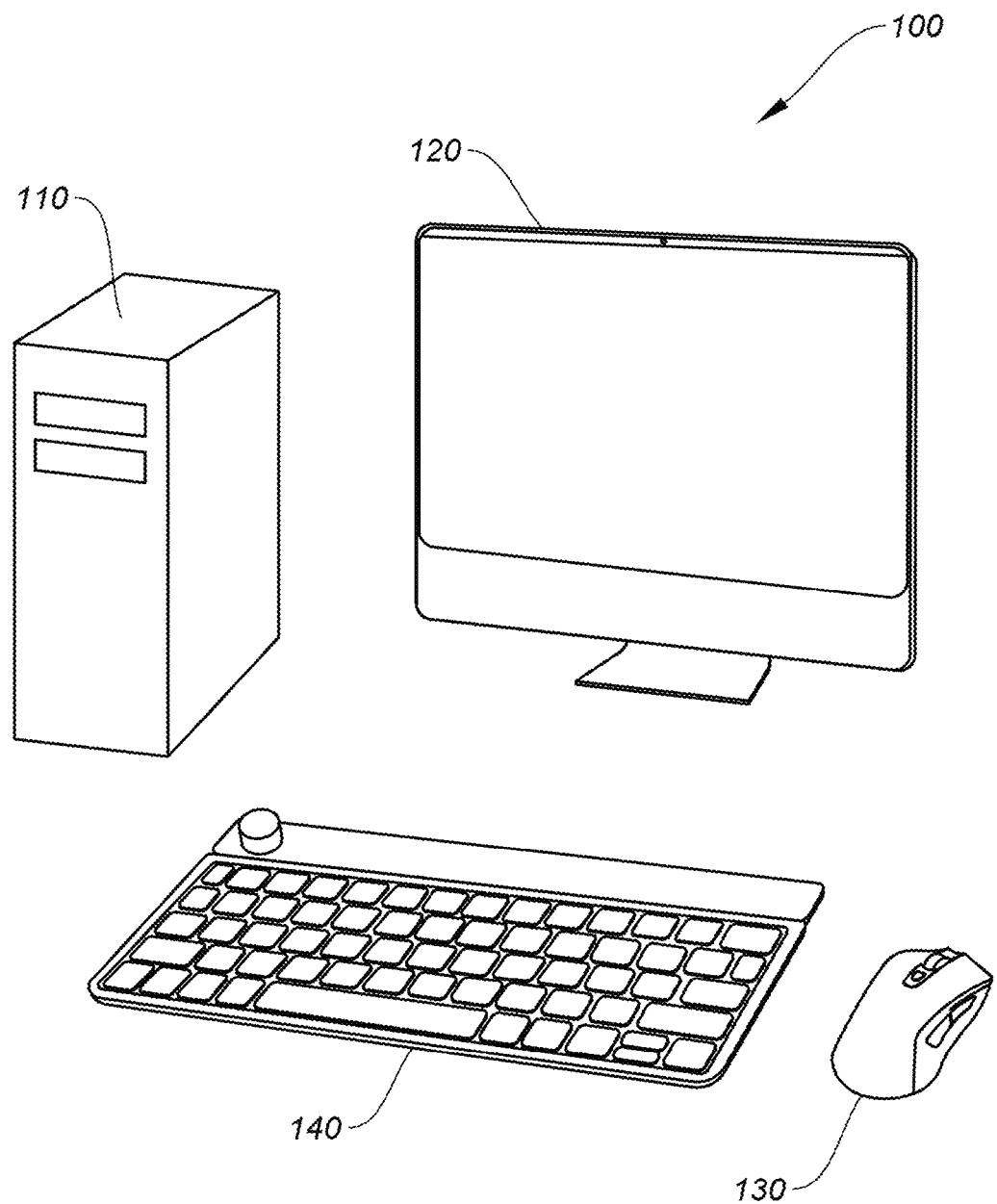
FIG. 1 shows an example of a computer system that can include any of a variety of host computing devices and computer peripheral devices, including peripheral devices (e.g., a computer mouse, keyboard, etc.) that can be configured to perform aspects of the various inventive concepts described herein.

Aspects of the present disclosure relate generally to computer peripheral devices, and more particularly to input elements on computer mice, according to certain embodiments. However, the concepts described herein can be readily applied to other input devices including keyboards, remote control devices, gaming controllers, and more, as would be appreciated by one of ordinary skill in the art with the benefit of this disclosure.

In the following description, various examples of electropermanent magnet (EPM)-based force profile control systems and methods of their use are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

The following high level summary is intended to provide a basic understanding of some of the novel innovations depicted in the figures and presented in the corresponding descriptions provided below. Aspects of the invention relate to the generation of a feedback profile for an input element on a computer peripheral device (referred to herein as "input devices"), which may including computer mice, keyboards, virtual/augmented/mixed reality controllers, media and gaming controllers, and other human interface machine (HMI) input devices, by employing the use of a magneto-mechano-electric system (referred to herein as "the EPM system") capable of affording an adaptable and customizable feedback to the user. The novel EPM systems described herein can be integrated into the mechanical architecture of an input device, where a movable mouse key plate, keyboard key, push-button, or slider alike allows the user to depress the device to achieve a desired interaction (e.g., a desired force feedback profile). The EPM system allows a modulation of force feedback profile by changing its magnetic field intensity, through an instantaneous electric discharge, while remaining stable in the mechanical component. This magnetic modulation produces a noticeable shift in the afforded feedback cues (e.g. the force feedback profile) and allows a full reversal of the magnetic field in part of its system, leading to a null contribution of this sub-architecture component—where only the mechanical contribution remains noticeable to users. In other words, a force feedback profile (also referred to herein as "feedback," "force feedback," "friction profile," and "feedback profile") may be comprised of a first bias contributor (e.g., the mechanical parts of the input element) and a second bias contributor (e.g., the EPM-controlled parts of the input element), and the second bias contributor can be turned on or off instantaneously (e.g., approximately 1 ms or less), which can markedly change the force feedback profile dynamically, immediately (from a user perspective), and in real-time for unprecedented control in feedback profile timing, complexity, calibration, and variability, without comparable deleterious effects of longevity (e.g., wear-and-tear) that materially affect other contemporary input devices.

In practice, embodiments of the present invention can produce an near-instantaneous shift in the force feedback profile from a quasi-linear behavior to one that can be regarded as a strong "clicky" confirmatory feedback, as would be appreciated by one of ordinary skill in the art with the benefit of this disclosure. Within this wide range of afforded feedback, many discrete levels can be determined via the parameters of the electric discharge, allowing an effective and near instant shift into many levels of overall feedback intensity. As this modulation can be performed electronically, it is also controllable via firmware and/or software. The application of this capability can be regarded as a fully customizable click event for an input element, where the feedback intensity level can be set by the manufacturing process, the user, and by a software application.

For the manufacturing process, monitoring automated quality control processes can control the EPM system to modulate the feedback profile of the input element(s) to better comply with an engineering specified User Experience (UX) target, hence mitigating the effects of parts and assembly tolerance deviations and other common factors that physically impact the feedback profile.

In certain embodiments, a user may adjust the operation of the EPM system via front/back end UI software that can allow the user to determine which level of "click" (the feedback profile) is to be afforded at any given moment, from non-clicky "stealth" modes, to linear modes, tactile modes, clicky modes, and up to highly resistant non-operative modes that strongly resist movement of the input element, and any setting there between, including combinations thereof where the feedback profile changes in real-time mid-click, where the profile changes such that a first feedback profile is applied to an input element while it is being depressed, and a second feedback profile is applied while the input element is being released, or any suitable feedback profile schema. One of ordinary skill in the art with the benefit of this disclosure would appreciate the many modifications, variations, and alternative embodiments thereof. In some aspects, a user may adjust the operation of the EPM system through a tertiary controller or input devices (e.g., push buttons, rotary dials), similar to DPI+/−buttons or DPI shift, according to certain embodiments, which can be a HW/FW setting without software involvement.

In some embodiments, an application, including external software applications (e.g., games, productivity software, etc.) can be used with the EPM system to modulate the click intensity of the feedback profile according to a function and/or context at any given moment, hence improving usability and immersion for the user.

In some aspects, the EPM system is generally in a non-power consuming (passive) mode of operation. Power is only consumed by the EPM system during a moment of modulation to change the feedback profile. During normal user operation where the feedback profile is already set and the user performs typical operations such as clicking and typing, the feedback profile is solely driven by the magneto-mechano system in its stable configuration and without any electric contribution. In other words, the EPM system can be used to "program" the magnetic field of the EPM system, which affects the feedback profile. This programming can be done on the order of milliseconds or less. Once programmed, the magnetic field remains stable and no additional current is consumed or required for the magnetic field to be maintained. At this stage, the feedback profile no longer consumes electrical power to be maintained. Thus, any suitable feedback profile can be generated using both an EPM-programmed magnetic field and, in some embodiments, an additional mechanical biasing mechanism(s), which can be modulated in real-time to create any desired feedback profile, which effectively consumes no power once the feedback profile is set, and is subject to little or no wear-and-tear on the EPM-controlled elements of the system.

It is to be understood that this high level summary is presented to provide the reader with a baseline understanding of some of the novel aspects of the present disclosure and a roadmap to the details that follow. This high level summary in no way limits the scope of the various embodiments described throughout the detailed description and each of the figures referenced above are further described below in greater detail and in their proper scope.

FIG. 1 shows an example of a computer system 100 that can include any of a variety of host computing devices and computer peripheral devices, including peripheral devices (e.g., a computer mouse, keyboard, etc.) that can be configured to perform aspects of the various inventive concepts described herein. Computer system 100 shows a host computing device (shown as a desktop computer) 110 and a number of computer peripheral devices communicatively coupled to and integrated with the host computing device, including a display device 120, a computer mouse 130, and a keyboard 140. Each computer peripheral device 120-140 can be communicatively coupled to host computing device 110.

Although the host computing device is shown as a desktop computer, other types of host computing devices can be used including gaming systems, laptop computers, set top boxes, entertainment systems, tablet or "phablet" computers, stand-alone head mounted displays ("HMD"), or any other suitable host computing device (e.g., smart phone, smart wearable, or the like). In some cases, multiple host computing devices may be used and one or more of the computer peripheral devices may be communicatively coupled to one or both of the host computing devices (e.g., a computer mouse may be coupled to multiple host computing devices). A host computing device may also be referred to herein as a "host computer," "host device," "computing device," "computer," or the like, and may include a machine readable medium (not shown) configured to store computer code, such as driver software, firmware, and the like, where the computer code may be executable by one or more processors of the host computing device(s) to control aspects of the host computing device, for instance via the one or more computer peripheral devices, as would be appreciated by one of ordinary skill in the art with the benefit of this disclosure.

A typical computer peripheral device can include any suitable input device, output device or input/output device including those shown (e.g., computer mouse 130, keyboard 140) and not shown (e.g., remote control, wearables (e.g., gloves, watch, head mounted display), AR/VR controller, a CAD controller, joystick, simulation shifter, stylus device, or other suitable device) that can be used, for example, to convert analog inputs into digital signals for computer processing. By way of example, a computer peripheral device (e.g., computer mouse 130) can be configured to provide control signals for movement tracking (e.g., x-y movement on a planar surface, three-dimensional "in-air" movements, etc.), touch and/or gesture detection, lift detection, orientation detection (e.g., in 3 degrees-of-freedom (DOF) system, 6 DOF systems, etc.), power management capabilities, input detection on one or more input elements (e.g., buttons, scroll wheels, keys, or other input elements), output functions (e.g., LED control, haptic feedback, audio feedback, etc.), or any of a myriad other features that can be provided by a computer peripheral device, as would be appreciated by one of ordinary skill in the art. Computer mouse 130, for instance, can include a housing and input elements such as buttons and a rotary control ("scroll wheel"). The buttons and/or the scroll wheel mechanism of computer mouse 130 and/or the keys of keyboard 140 can include an EPM actuator for changing a feedback profile associated with the pressing of the button(s), key(s), or the rotation of the scroll wheel, as further described in certain embodiments that follow.

A computer peripheral device may be referred to as an "input device," "peripheral input device," "peripheral," or the like. The majority of the embodiments described herein generally refer to computer peripheral devices 130, however it should be understood that a computer peripheral device can be any suitable input/output (I/O) device (e.g., user interface device, control device, input unit, or the like) that may be adapted to utilize the novel embodiments described and contemplated herein.

A System for Operating a Computer Peripheral Device

Figure 2:
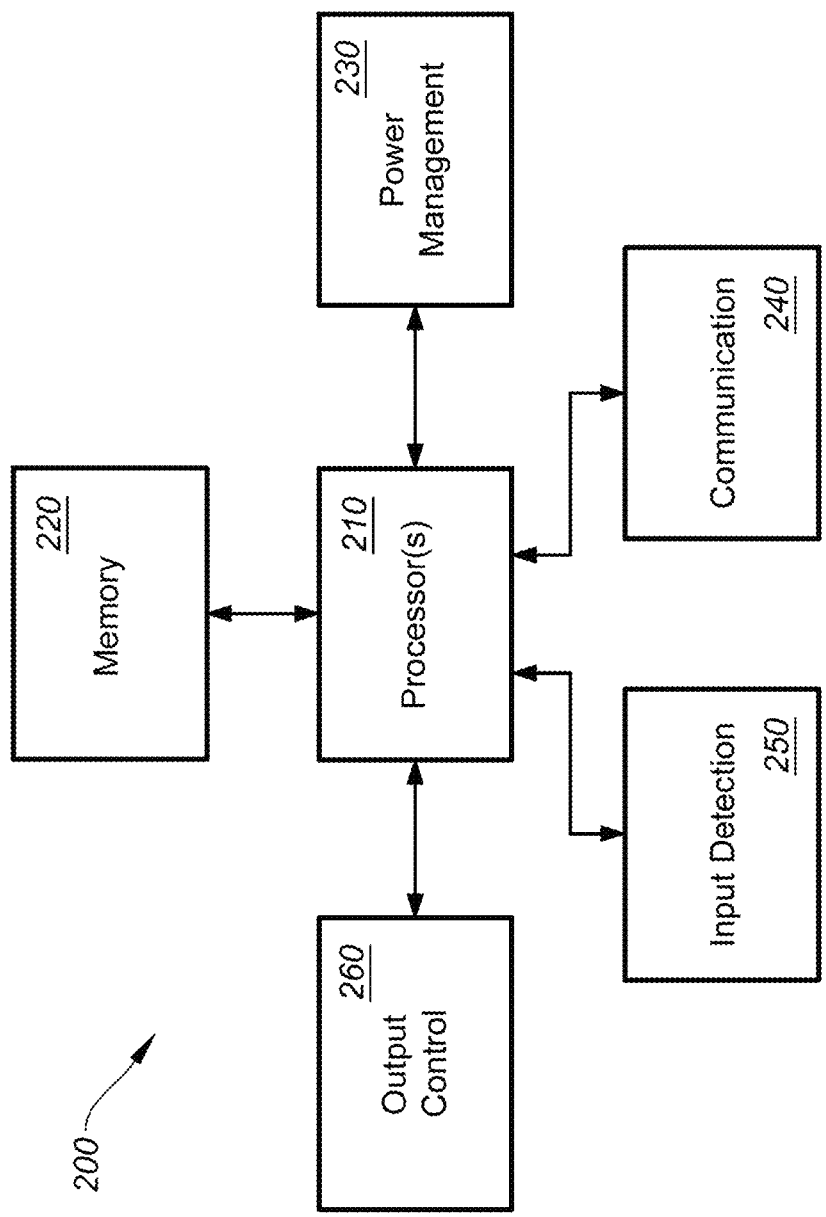
FIG. 2 shows a system for operating a computer peripheral device, according to certain embodiments.

FIG. 2 shows a system 200 for operating a computer peripheral device 130, according to certain embodiments. System 200 may be configured to operate any of the computer peripheral devices specifically shown or not shown herein but within the wide purview of the present disclosure. System 200 may include processor(s) 210, memory block 220, power management block 230, communication block 240, input detection block 250, and output control block 260. Each of the system blocks 220-260 can be in electronic communication with processor(s) 210 (e.g., via a bus system). System 200 may include additional functional blocks that are not shown or discussed to prevent obfuscation of the novel features described herein. System blocks 220-260 (also referred to as "modules") may be implemented as separate block, or alternatively, more than one system block may be implemented in a single module. In the context described herein, system 200 can be incorporated into any input device described herein and may be configured to incorporate any of the various EPM systems or perform any of the various methods of utilizing an EPM system in the manner described below at least with respect to FIGS. 6-15, as would be appreciated by one of ordinary skill in the art with the benefit of this disclosure.

In certain embodiments, processor(s) 210 may include one or more microprocessors and can be configured to control the operation of system 200. Alternatively or additionally, processor(s) 210 may include one or more microcontrollers (MCUs), digital signal processors (DSPs), or the like, with supporting hardware and/or firmware (e.g., memory, programmable I/Os, etc.), and/or software, as would be appreciated by one of ordinary skill in the art. Processor(s) 210 can control some or all aspects of the operation of computer peripheral devices 130, 140 (e.g., system block 220-260). Alternatively or additionally, some of system blocks 220-260 may include an additional dedicated processor, which may work in conjunction with processor(s) 210. For instance, MCUs, μCs, DSPs, and the like, may be configured in other system blocks of system 200. Communication block 240 may include a local processor, for instance, to control aspects of communication with host computer 110 (e.g., via Bluetooth, Bluetooth LE, RF, IR, hardwire, ZigBee, Z-Wave, Logitech Unifying, or other communication protocol). Processor(s) 210 may be local to the peripheral device (e.g., contained therein), may be external to the peripheral device (e.g., off-board processing, such as by a corresponding host computing device), or a combination thereof. Processor(s) 210 may perform any of the various functions and methods (e.g., method 1500) described and/or covered by this disclosure in conjunction with any other system blocks in system 200. In some implementations, processor 302 of FIG. 3 may work in conjunction with processor(s) 210 to perform some or all of the various methods described throughout this disclosure. In some embodiments, multiple processors may enable increased performance characteristics in system 200 (e.g., speed and bandwidth), however multiple processors are not required, nor necessarily germane to the novelty of the embodiments described herein. One of ordinary skill in the art would understand the many variations, modifications, and alternative embodiments that are possible.

Memory block ("memory" or "memory array") 220 can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM) and/or applications stored in media storage that can be read into memory for execution by processing devices (e.g., processor(s) 210). Software can be implemented as a single program or a collection of separate programs and can be stored in non-volatile storage and copied in whole or in-part to volatile working memory during program execution. In some embodiments, memory 220 may store data corresponding to inputs on one or more input elements on the peripheral device, such as a detected movement of the peripheral device via a sensor (e.g., optical sensor, accelerometer, etc.), activation of one or more input elements (e.g., buttons, sliders, touch-sensitive regions, etc.), or the like. Stored data may be aggregated and send via reports (e.g., human interface device (HID) reports) to a host computing device.

In certain embodiments, memory 220 can store the various data described throughout this disclosure. For example, memory 220 can store and/or include optical data, dynamically adjustable memory pages, and more germane to the present disclosure the memory array can store various settings for the EPM magnetizing assembly to magnetize one or more magnets at a polarity and/or any number of intensity levels to control, for example, a feedback profile for an input element on an input device. In some cases, the intensity can be referred to as a magnetic field strength, commonly measured in SI base units of ampere per meter (A/m). Memory 220 can be used to store any suitable data to perform any function described herein and as would be appreciated by one of ordinary skill in the art with the benefit of this disclosure. Memory 220 can be referred to as a storage system or storage subsystem, and can store one or more software programs to be executed by processors (e.g., in processor(s) 210). It should be understood that "software" can refer to sequences of instructions that, when executed by processing unit(s) (e.g., processors, processing devices, etc.), cause system 200 to perform certain operations of software programs. The instructions can be stored as firmware residing in read-only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations (e.g., software-controlled feedback profile setting selections, etc.) as described herein.

Power management block 230 can be configured to manage power distribution, recharging, power efficiency, haptic motor power control, and the like. In some embodiments, power management block 230 (also referred to as power management 230 or power management system 230) can include a battery (not shown), a Universal Serial Bus (USB)-based recharging system for the battery (not shown), power management devices (e.g., voltage regulators—not shown), and a power grid within system 200 to provide power to each subsystem (e.g., communications block 240, etc.). In certain embodiments, the functions provided by power management system 230 may be incorporated into processor(s) 210. Alternatively, some embodiments may not include a dedicated power management block. For example, functional aspects of power management block 230 may be subsumed by another block (e.g., processor(s) 210) or in combination therewith. The power source can be a replaceable battery, a rechargeable energy storage device (e.g., super capacitor, Lithium Polymer Battery, NiMH, NiCd), or a corded power supply. The recharging system can be an additional cable (specific for the recharging purpose) or it can use a USB connection to recharge the battery.

In some embodiments, power management block 230 may control aspects of the EPM assembly's magnetizing assembly that sets a polarity and intensity of a magnetic field of one or more magnets. For instance, power management system 230 may set a current pulse amplitude, duration, and/or frequency that drives a coil that is operable to generate a magnetizing field that magnetizes the one or more magnets. Typically, a single pulse is used to change the magnetization and/or polarization of the magnet(s). In some cases, AC current can be used to completely remove the magnet's magnetization. In certain embodiments, multiple pulses might be used to quickly change to dynamically change an input element's force profile as it is being pressed and/or released, for haptic effects, or the like. Any number of drive settings (e.g., different combinations of current pulse amplitude, duration, and/or frequency) may be stored that can affect the feedback profile of one or more input elements, as further described below. One of ordinary skill in the art with the benefit of this disclosure would appreciate the many modifications, variations, and alternative embodiments thereof.

Communication block 240 (also referred to as "communication system 240") can be configured to enable wireless communication with a corresponding host computing device (e.g., 110), or other devices and/or computer peripheral devices, according to certain embodiments. Communication block 240 can be configured to provide radio-frequency (RF), Bluetooth®, Logitech proprietary communication protocol (e.g., Unifying, Logi Bolt®, Gaming Light Speed, or others), infra-red (IR), ZigBee®, Z-Wave, or other suitable communication technology to communicate with other computing devices and/or peripheral devices. System 200 may optionally comprise a hardwired connection to the corresponding host computing device. For example, computer peripheral device 130 can be configured to receive a USB, FireWire®, Thunderbolt®, or other universal-type cable to enable bi-directional electronic communication with the corresponding host computing device or other external devices. Some embodiments may utilize different types of cables or connection protocol standards to establish hardwired communication with other entities. In some aspects, communication ports (e.g., USB), power ports, etc., may be considered as part of other blocks described herein (e.g., input detection block 250, output control block 260, etc.). In some aspects, communication system 240 can send reports generated by the processor(s) 210 (e.g., HID data, streaming or aggregated data, etc.) to a host computing device. In some cases, the reports can be generated by the processor(s) only, in conjunction with the processor(s), or other entity in system 200. Communication system 240 may incorporate one or more antennas, oscillators, etc., and may operate at any suitable frequency band (e.g., 2.4 GHz). One of ordinary skill in the art with the benefit of this disclosure would appreciate the many modifications, variations, and alternative embodiments thereof.

Input detection block 250 can control the detection of a user-interaction with input elements (also referred to as "elements") on an input device. For instance, input detection block 250 (also referred to as input detection module 250) can detect user inputs from motion sensors, keys, buttons, roller wheels, scroll wheels, track balls, touch pads (e.g., one and/or two-dimensional touch sensitive touch pads), click wheels, dials, keypads, microphones, GUIs, touch-sensitive GUIs, proximity sensors (e.g., infra-red, thermal, etc.), image sensor based detection such as gesture detection (e.g., via webcam), audio based detection such as voice input (e.g., via microphone), or the like, as would be appreciated by one of ordinary skill in the art with the benefit of this disclosure. Alternatively, the functions of input detection module 250 can be subsumed by processor 210, or in combination therewith.

In some embodiments, input detection block 250 can detect a touch or touch gesture on one or more touch sensitive surfaces on input device 130. Input detection block 250 can include one or more touch sensitive surfaces or touch sensors. Touch sensors generally comprise sensing elements suitable to detect a signal such as direct contact, electromagnetic or electrostatic fields, or a beam of electromagnetic radiation. Touch sensors can typically detect changes in a received signal, the presence of a signal, or the absence of a signal. A touch sensor may include a source for emitting the detected signal, or the signal may be generated by a secondary source. Touch sensors may be configured to detect the presence of an object at a distance from a reference zone or point (e.g., <5 mm), contact with a reference zone or point, or a combination thereof. Certain embodiments of computer peripheral devices 130, 140 may or may not utilize touch detection or touch sensing capabilities.

Input detection block 250 can include touch and/or proximity sensing capabilities. Some examples of the types of touch/proximity sensors may include, but are not limited to, resistive sensors (e.g., standard air-gap 4-wire based, based on carbon loaded plastics which have different electrical characteristics depending on the pressure (FSR), interpolated FSR, strain gages, etc.), capacitive sensors (e.g., surface capacitance, self-capacitance, mutual capacitance, etc.), optical sensors (e.g., infrared light barriers matrix, laser based diode coupled with photo-detectors that could measure the time of flight of the light path, etc.), acoustic sensors (e.g., piezo-buzzer coupled with microphones to detect the modification of a wave propagation pattern related to touch points, etc.), inductive sensors, magnetic sensors (e.g., Hall Effect), direct electric or galvanic pole contact between low resistance or conductive materials, or the like.

Input detection block 250 may include a movement tracking sub-block that can be configured to detect a relative displacement (movement tracking) of the computer peripheral device 130. For example, input detection block 250 optical sensor(s) such as IR LEDs and an imaging array of photodiodes to detect a movement of computer peripheral device 130 relative to an underlying surface. Computer peripheral device 130 may optionally include movement tracking hardware that utilizes coherent (laser) light. Moving tracking can provide positional data (e.g., delta X and delta Y data from last sampling) or lift detection data. For example, an optical sensor can detect when a user lifts computer peripheral device 130 off of an underlying surface (also referred to as a "work surface") and can send that data to processor 210 for further processing. In some embodiments, processor 210, the movement tracking block (which may include an additional dedicated processor), or a combination thereof, may perform aspects of input detection, as would be appreciated by one of ordinary skill in the art with the benefit of this disclosure.

In certain embodiments, accelerometers can be used for movement detection. Accelerometers can be electromechanical devices (e.g., micro-electromechanical systems (MEMS) devices) configured to measure acceleration forces (e.g., static and dynamic forces). One or more accelerometers can be used to detect three dimensional (3D) positioning. For example, 3D tracking can utilize a three-axis accelerometer or two two-axis accelerometers (e.g., in a "3D air mouse," HMD, or other device). Accelerometers can further determine if the input device 130 has been lifted off of an underlying surface and can provide movement data that may include the velocity, physical orientation, and acceleration of computer peripheral device 130. In some embodiments, gyroscope(s) can be used in lieu of or in conjunction with accelerometer(s) to determine movement or input device orientation.

In some embodiments, output control block 260 (also referred to as "output control module 260") can control various outputs for a corresponding computer peripheral device. For instance, output control module 260 may control a number of visual output elements (e.g., LEDs, LCD screens), displays, audio outputs (e.g., speakers), haptic output systems, or the like. One of ordinary skill in the art with the benefit of this disclosure would appreciate the many modifications, variations, and alternative embodiments thereof.

Although certain systems may not be expressly discussed, they should be considered as part of system 200, as would be understood by one of ordinary skill in the art. For example, system 200 may include a bus system to transfer power and/or data to and from the different systems therein. It should be appreciated that system 200 is illustrative and that variations and modifications are possible. System 200 can have other capabilities not specifically described herein. Further, while system 200 is described with reference to particular blocks, it is to be understood that these blocks are defined for convenience of description and are not intended to imply a particular physical arrangement of component parts. Further, the blocks need not correspond to physically distinct components. Blocks can be configured to perform various operations, e.g., by programming a processor or providing appropriate control circuitry, and various blocks might or might not be reconfigurable depending on how the initial configuration is obtained.

Embodiments of the present invention can be realized in a variety of apparatuses including electronic devices (e.g., computer peripheral devices) implemented using any combination of circuitry and software. Furthermore, aspects and/or portions of system 200 may be combined with or operated by other sub-systems as required by design. For example, input detection block 250 and/or memory 220 may operate within processor(s) 210 instead of functioning as a separate entity. In addition, the inventive concepts described herein can also be applied to any electronic device. Further, system 200 can be applied to any of the computer peripheral devices described in the embodiments herein, whether explicitly, referentially, or tacitly described (e.g., would have been known to be applicable to a particular computer peripheral device by one of ordinary skill in the art). The foregoing embodiments are not intended to be limiting and those of ordinary skill in the art with the benefit of this disclosure would appreciate the myriad applications and possibilities.

System for Operating a Host Computing Device

Figure 3:
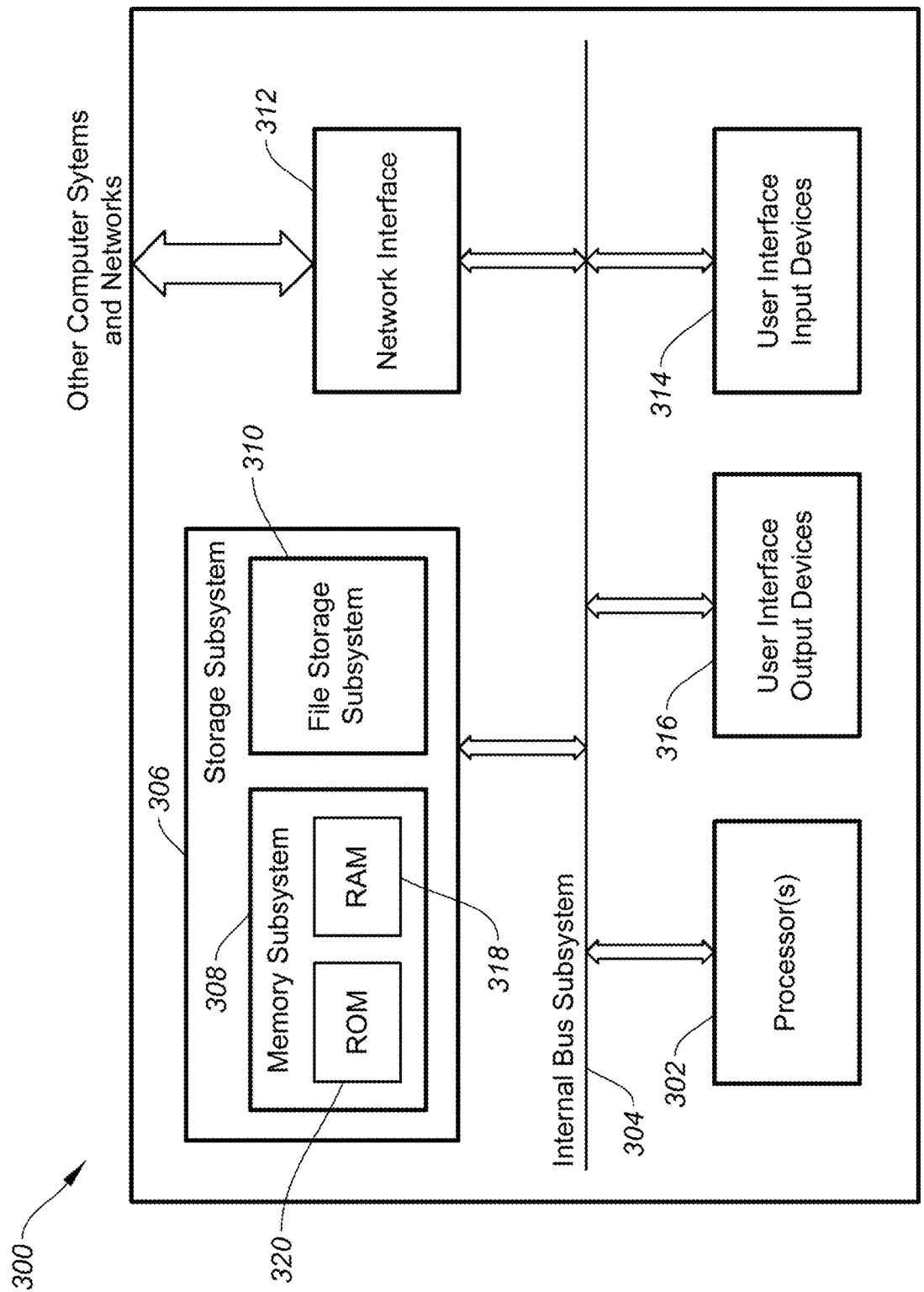
FIG. 3 shows is a simplified block diagram of a host computing device, according to certain embodiments.

FIG. 3 is a simplified block diagram of a host computing device 300, according to certain embodiments. Host computing device 300 can implement some or all functions, behaviors, and/or capabilities described above that would use electronic storage or processing, as well as other functions, behaviors, or capabilities not expressly described. Host computing device 300 can include a processing subsystem (processor(s)) 302, a storage subsystem 306, user interfaces 314, 316, and a communication interface 312. Computing device 300 can also include other components (not explicitly shown) such as a battery, power controllers, and other components operable to provide various enhanced capabilities. In various embodiments, host computing device 300 can be implemented in any suitable computing device, such as a desktop or laptop computer (e.g., desktop 110), mobile device (e.g., tablet computer, smart phone, mobile phone), wearable device, media device, or the like, or in peripheral devices (e.g., keyboards, etc.) in certain implementations.

Processor(s) 302 can include MCU(s), micro-processors, application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, or electronic units designed to perform a function or combination of methods, functions, etc., described throughout this disclosure.

Storage subsystem 306 can be implemented using a local storage and/or removable storage medium, e.g., using disk, flash memory (e.g., secure digital card, universal serial bus flash drive), or any other non-transitory storage medium, or a combination of media, and can include volatile and/or non-volatile storage media. Local storage can include a memory subsystem 308 including random access memory (RAM) 318 such as dynamic RAM (DRAM), static RAM (SRAM), synchronous dynamic RAM (e.g., DDR), or battery backed up RAM or read-only memory (ROM) 320, or a file storage subsystem 310 that may include one or more code modules. In some embodiments, storage subsystem 306 can store one or more applications and/or operating system programs to be executed by processing subsystem 302, including programs to implement some or all operations described above that would be performed using a computer. For example, storage subsystem 306 can store one or more code modules for implementing one or more method steps described herein.

A firmware and/or software implementation may be implemented with modules (e.g., procedures, functions, and so on). A machine-readable medium tangibly embodying instructions may be used in implementing methodologies described herein. Code modules (e.g., instructions stored in memory) may be implemented within a processor or external to the processor. As used herein, the term "memory" refers to a type of long term, short term, volatile, nonvolatile, or other storage medium and is not to be limited to any particular type of memory or number of memories or type of media upon which memory is stored.

Moreover, the term "storage medium" or "storage device" may represent one or more memories for storing data, including read only memory (ROM), RAM, magnetic RAM, core memory, magnetic disk storage mediums, optical storage mediums, flash memory devices and/or other machine readable mediums for storing information. The term "machine-readable medium" includes, but is not limited to, portable or fixed storage devices, optical storage devices, wireless channels, and/or various other storage mediums capable of storing instruction(s) and/or data.

Furthermore, embodiments may be implemented by hardware, software, scripting languages, firmware, middleware, microcode, hardware description languages, and/or any combination thereof. When implemented in software, firmware, middleware, scripting language, and/or microcode, program code or code segments to perform tasks may be stored in a machine readable medium such as a storage medium. A code segment (e.g., code module) or machine-executable instruction may represent a procedure, a function, a subprogram, a program, a routine, a subroutine, a module, a software package, a script, a class, or a combination of instructions, data structures, and/or program statements. A code segment may be coupled to another code segment or a hardware circuit by passing and/or receiving information, data, arguments, parameters, and/or memory contents. Information, arguments, parameters, data, etc. may be passed, forwarded, or transmitted by suitable means including memory sharing, message passing, token passing, network transmission, etc. These descriptions of software, firmware, storage mediums, etc., apply to systems 200 and 300, as well as any other implementations within the wide purview of the present disclosure. In some embodiments, aspects of the invention (e.g., surface classification) may be performed by software stored in storage subsystem 306, stored in memory 220 of a computer peripheral device, or both. One of ordinary skill in the art with the benefit of this disclosure would appreciate the many modifications, variations, and alternative embodiments thereof.

Implementation of the techniques, blocks, steps and means described throughout the present disclosure may be done in various ways. For example, these techniques, blocks, steps and means may be implemented in hardware, software, or a combination thereof. For a hardware implementation, the processing units may be implemented within one or more ASICs, DSPs, DSPDs, PLDs, FPGAs, processors, controllers, micro-controllers, microprocessors, other electronic units designed to perform the functions described above, and/or a combination thereof.

Each code module may comprise sets of instructions (codes) embodied on a computer-readable medium that directs a processor of a host computing device 110 to perform corresponding actions. The instructions may be configured to run in sequential order, in parallel (such as under different processing threads), or in a combination thereof. After loading a code module on a general purpose computer system, the general purpose computer is transformed into a special purpose computer system.

Computer programs incorporating various features described herein (e.g., in one or more code modules) may be encoded and stored on various computer readable storage media. Computer readable media encoded with the program code may be packaged with a compatible electronic device, or the program code may be provided separately from electronic devices (e.g., via Internet download or as a separately packaged computer readable storage medium). Storage subsystem 306 can also store information useful for establishing network connections using the communication interface 312.

Computer system 300 may include user interface input devices 314 elements (e.g., touch pad, touch screen, scroll wheel, click wheel, dial, button, switch, keypad, microphone, etc.), as well as user interface output devices 316 (e.g., video screen, indicator lights, speakers, headphone jacks, virtual- or augmented-reality display, etc.), together with supporting electronics (e.g., digital to analog or analog to digital converters, signal processors, etc.). A user can operate input devices of user interface 314 to invoke the functionality of computing device 300 and can view and/or hear output from computing device 300 via output devices of user interface 316.

Processing subsystem 302 can be implemented as one or more processors (e.g., integrated circuits, one or more single core or multi core microprocessors, microcontrollers, central processing unit, graphics processing unit, etc.). In operation, processing subsystem 302 can control the operation of computing device 300. In some embodiments, processing subsystem 302 can execute a variety of programs in response to program code and can maintain multiple concurrently executing programs or processes. At a given time, some or all of a program code to be executed can reside in processing subsystem 302 and/or in storage media, such as storage subsystem 304. Through programming, processing subsystem 302 can provide various functionality for computing device 300. Processing subsystem 302 can also execute other programs to control other functions of computing device 300, including programs that may be stored in storage subsystem 304.

Communication interface (also referred to as network interface) 312 can provide voice and/or data communication capability for computing device 300. In some embodiments, communication interface 312 can include radio frequency (RF) transceiver components for accessing wireless data networks (e.g., Wi-Fi network; 3G, 4G/LTE; etc.), mobile communication technologies, components for short range wireless communication (e.g., using Bluetooth communication standards, NFC, etc.), other components, or combinations of technologies. In some embodiments, communication interface 312 can provide wired connectivity (e.g., universal serial bus (USB), Ethernet, universal asynchronous receiver/transmitter, etc.) in addition to, or in lieu of, a wireless interface. Communication interface 312 can be implemented using a combination of hardware (e.g., driver circuits, antennas, modulators/demodulators, encoders/decoders, and other analog and/or digital signal processing circuits) and software components. In some embodiments, communication interface 312 can support multiple communication channels concurrently.

User interface input devices 314 may include any suitable computer peripheral device (e.g., computer mouse, keyboard, gaming controller, remote control, stylus device, etc.), as would be appreciated by one of ordinary skill in the art with the benefit of this disclosure. User interface output devices 316 can include display devices (e.g., a monitor, television, projection device, etc.), audio devices (e.g., speakers, microphones), haptic devices, etc. Note that user interface input and output devices are shown to be a part of system 300 as an integrated system. In some cases, such as in laptop computers, this may be the case as keyboards and input elements as well as a display and output elements are integrated on the same host computing device. In some cases, the input and output devices may be separate from system 300, as shown in FIG. 1. One of ordinary skill in the art with the benefit of this disclosure would appreciate the many modifications, variations, and alternative embodiments thereof.

It will be appreciated that computing device 300 is illustrative and that variations and modifications are possible. A host computing device can have various functionality not specifically described (e.g., voice communication via cellular telephone networks) and can include components appropriate to such functionality. While the computing device 300 is described with reference to particular blocks, it is to be understood that these blocks are defined for convenience of description and are not intended to imply a particular physical arrangement of component parts. For example, processing subsystem 302, storage subsystem 306, user interfaces 314, 316, and communications interface 312 can be in one device or distributed among multiple devices. Further, the blocks need not correspond to physically distinct components. Blocks can be configured to perform various operations, e.g., by programming a processor or providing appropriate control circuitry, and various blocks might or might not be reconfigurable depending on how an initial configuration is obtained. Embodiments of the present invention can be realized in a variety of apparatus including electronic devices implemented using a combination of circuitry and software. Host computing devices or even peripheral devices described herein can be implemented using system 300.

Mechanical System Operational Principles

In purely mechanically-driven input elements, the mechanical system typically allows the input element (e.g., a key plate) to move, either by pivoting the structure around a rotational axis (e.g., the pushbutton action) and/or by flexing (e.g., the flexion of the input element itself). That is, movement of the input element can be a combination of axial rotation on a hinge and flexion and/or lateral/longitudinal rotation of the input element itself based on the input element's structural stiffness. The allowable travel of the input element is typically measurable at the region where the user presses. The mechanical system may provide a gradually increasing feedback that can be comprised of multi-stage stiffness changes, such as: (1) a preload stage, affording an initial resistance to key plate movement, preventing unwanted key plate free play, and resisting to a user resting its finger on the key plate; (2) a linear, quasi-linear, or non-linear stage, of gradually increasing force with key plate displacement; (3) a rapid force build up, of higher stiffness or exponential behavior, corresponding to an end-of-travel and/or stopper function; and (4) any configuration in between said steps above. In keyboard-type push-button input elements, linear/vertical movement is typically allowed.

This purely mechanical feedback is achieved by the involved components of the input element's own structural stiffness, and through the use of additional mechanical components. For example, mechanical feedback may be affected by employing a biasing mechanism such as a spring or multiples of springs, a combination of springs in parallel and/or series arrangements, springs and spring combinations under compression and/or extension, individual use or combinations of any types if biasing members including linear, torsion, flat-type, or the like, as well as metallic and non-metallic biasing members. In some cases, elastomers and other non-linear materials under extension or compression may be included. Some embodiments may employ mechanical stoppers to define a resting (free) position and end-of-travel, as well as impact dampers at the ends of operational travel, which can soften the impact of a bottoming-out of the input element and dampen acoustic emissions. Some implementations may employ gearing and stepped mechanisms, articulated and compliant mechanisms, and/or embedded or separate compliant and flex mechanisms. In some cases, non-mechanical stoppers can be used, such as using repulsing magnets, or an integrated magneto-mechanical stopper embedded on the EPM core itself, such as a dual-stage click where the second stage is a strong repulsive stopper.

Figure 4:
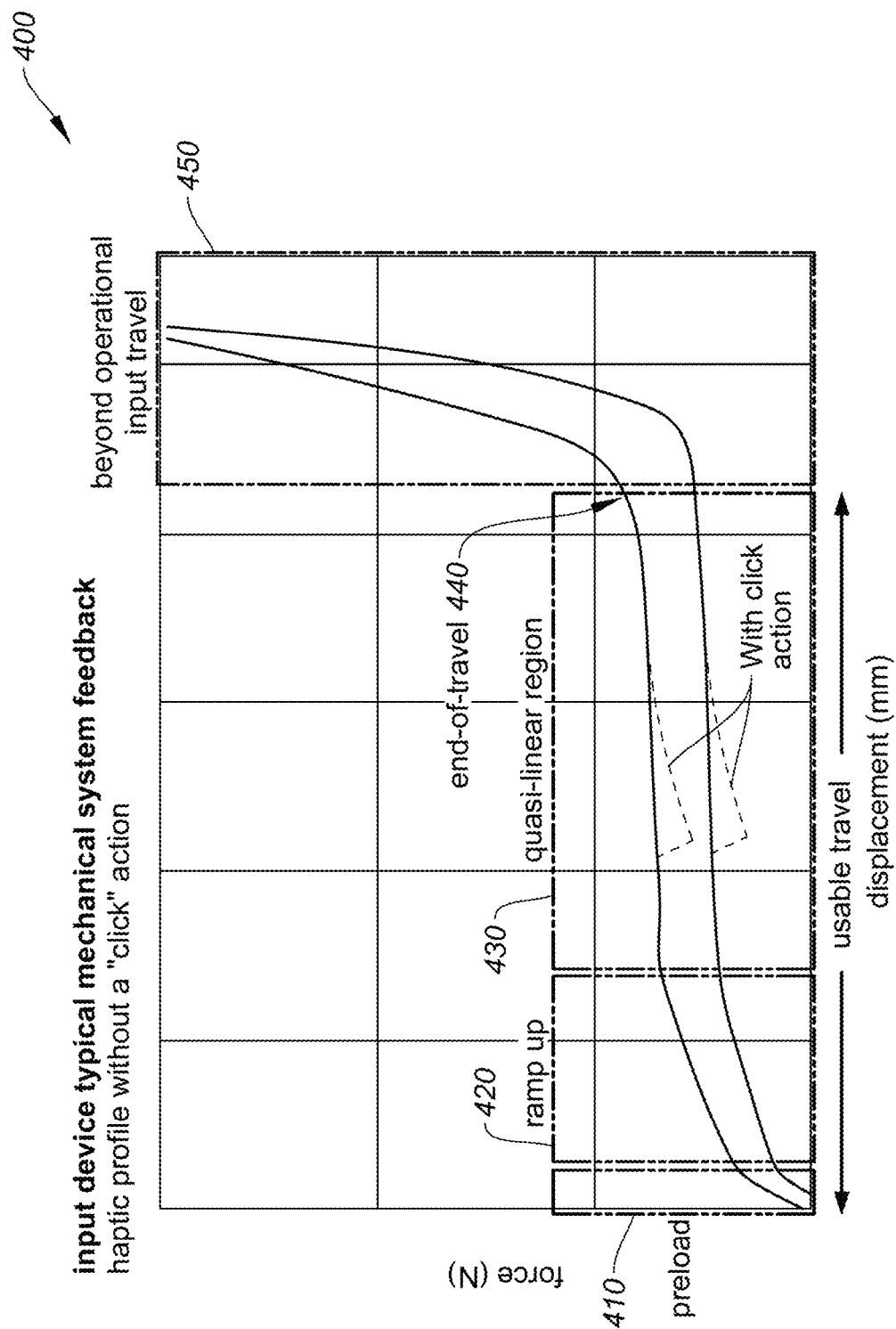
FIG. 4 is a graph showing a typical feedback profile for a mechanically-based input element, according to certain embodiments.

FIG. 4 is a graph 400 showing a feedback profile for a mechanically-based input element (with a click-portion removed), according to certain embodiments. Graph 400 shows a force vs. displacement curve including a pre-load phase 410, a ramp up phase 420, a quasi-linear region 430, an end-of-travel region 440, and a region beyond operational travel 450. Typically, the usable travel includes the preload and quasi-linear regions and stops at the end-of-travel region. The quasi-linear region 430 can vary widely depending on the intended design of the feedback profile. A linear-type feedback profile is shown, however other profiles may include tactile, clicky, or other type, as further described below and as would be appreciated by one of ordinary skill in the art with the benefit of this disclosure. Note that the EPM-based magnetic solutions described herein can add the click-portion of the feedback curve. In some aspects, the magnetically driven click provided by the EPM system is superimposed over the contribution of the mechanical system, and typically in the ramp up region or quasi-linear region, although it is possible to add one or more EPM-based click profiles anywhere on the feedback profile with any suitable characteristics (e.g., intensity).

Referring back to FIG. 4, initial pre-load section may be short and in some cases approximately up to 0.05 mm of travel. The transition between ramp-up and the quasi-linear region can be approximately between 0.15 mm to 0.3 mm, and the end of travel is typically around 0.6 mm to 0.8 mm. The tactile or clicky feeling typically happens during the second half of the ramp-up region, with a force between 30 gf to 80 gf. Note that FIG. 4 can be applied to mouse buttons, mechanical push-buttons or keys, or other mechanical type depressible input element, as would be appreciated by one of ordinary skill in the art with the benefit of this disclosure.

Mechanical input elements total usable travel typically range from less than a millimeter (as in computer mice), to a few millimeters (as in mechanical keyboards) to larger displacements as in industrial applications of push-buttons, safety switches, etc. In the case of computer mice, at the typical clicking region over the key plate, a total usable travel of less than 1 mm is often used for a complete interaction to occur. A range that is typically regarded as providing a good user experience (UX) for a computer mouse is between 0.30 mm-0.70 mm total travel for the corresponding input element. Mechanical keyboards typically have travel ranges between 1.5 mm-3.0 mm, while laptop keyboards can have shorter key movement.

Typically, the occurrence of the click, defined by a sudden and perceptible change in force, occurs in the quasi-linear region, along the force buildup of the feedback. This click is often expected to occur between 30% to 80% of the total usable travel. After the click instant, the remaining available usable travel may be designated as over travel. Over travel is often regarded as pertinent to both UX and functionality, as the click instant typically should not occur at the very end of the total usable travel. Beyond the usable travel range, the input device may then travel under a deformation of its mechanical structure. This may be characterized by a significant force build up (e.g., exponential) and is typically no longer regarded as part of the system feedback intentionally afforded to the user. In some aspects, pre-travel is the free-movement or free play of the device with no or very low force feedback given before the input feedback. Note that the ranges given above are for some exemplary embodiments and do not limit the application of the novel concepts provided herein. Other ranges, travel definitions (e.g., besides pre-travel, quasi-linear, etc.), and applications are possible, as would be appreciated by one of ordinary skill in the art with the benefit of this disclosure.

Typically, input devices, such as push-buttons, operate under an operational force range to sense the interaction from the user that ranges from tenths of grams to hundreds of grams for some of the input devices considered herein. For computer mice, the force range is usually between 30 gf-100 gf (1N) for primary inputs (main left/right buttons) while secondary and tertiary inputs can be as high as 300 gf (3N) or more. Keyboards have similar operational force ranges to primary mice buttons. Typically, a user applies two to five times more force than is required to actually complete the interaction. However, this force can be taken by the system, by completing the remaining usable travel (e.g., the over travel) and beyond the system total available travel. For the perception of the tactile cues afforded at the sensing instant, the click which can be a resultant of a sudden force-drop in a mechanical type key, and taking into considerations human factors such as average "Just-Noticeable Differences" and average Weber Fraction (Weber's Law), the perception of this click often is at least a 10% instant shift in force for the interaction to be well perceived by the user. It is often regarded that higher values are more positive towards UX, while also contemplating users with lower tactile acuity than average. Preload values, the initial resistance to movement in the device, are usually below 20% of the operational force required for completing the interaction. For stiffness, the slope of the quasi-linear region varies and can be approximated by the ratio between operational force and operational travel, or total force to total usable travel. For computer mice, values between 1 N/mm and 3 N/mm are common.

Electro-Permanent Magnets (EPM) and Aspects of Operation

Electro-permanent magnets present a number of advantages over more conventional systems in input devices that utilize permanent magnets and/or electromagnets. A permanent magnet can be an object made from a material that is magnetized and creates its own persistent magnetic field. Materials that can be magnetized, which are also the same materials that are strongly attracted to a magnet, are called ferromagnetic materials and typically include at least one of the elements iron, nickel and cobalt and their alloys, some alloys of rare-earth metals, and some naturally occurring minerals such as lodestone. Ferromagnetic materials can comprised of magnetically "soft" materials like annealed iron, which can be magnetized but do not tend to stay magnetized, and magnetically "hard" materials, which tend to stay magnetized. Permanent magnets are made from "hard" ferromagnetic materials such as alnico (e.g., iron alloy typically comprised of aluminum, nickel, and cobalt, as well as copper and/or titanium) and ferrite (e.g., ceramic material comprised of iron (III) oxide (e.g., $Fe_2O_3$, rust) blended with barium, manganese, nickel, and/or zinc) that are subjected to processing in a strong magnetic field during manufacture to align their internal microcrystalline structure, making them very hard to demagnetize. In order to demagnetize a saturated magnet, a certain magnetic field must be applied, and this threshold depends on a coercivity of the respective material. "Hard" materials typically have high coercivity, whereas "soft" materials typically have low coercivity. The overall strength of a magnet is measured by its magnetic moment or, alternatively, the total magnetic flux it produces. For the purposes of this disclosure, this can be referred to as the magnetic field intensity. A significant drawback of using permanent magnets is that their application can be limited as one magnetic field intensity typically cannot be practicably increased or decreased to control, for instance, different levels of rotational friction on a scroll wheel or different feedback response profiles on a button or key.

An electromagnet is comprised of a coil of wire that operates as a magnet when an electric current passes through it but stops operating like a magnet when the current stops. Often, the coil is wrapped around a core of "soft" ferromagnetic material such as mild steel, which can substantially increase the magnetic field produced by the coil. As described above, although an electromagnet can generate a range of magnetic field intensities, an electromagnet requires continuous power to maintain the magnetic field, which can prohibit practical use in most battery powered input devices because of the high power consumption required and the likely significant corresponding reduction in battery life.

In an EPM circuit (also referred to herein as an "EPM core," "EPM system," or "EPM assembly"), once the magnet is magnetized (e.g., both polarity and magnetic intensity) by the EPM system via the coil, the power through the coil can be shut off and the magnet maintains its newly established magnetic field intensity without any additional power needed to maintain it. As such, any desired feedback profile can be achieved, thereby allowing multiple settings for certain features such as linearly adjustable input elements (e.g., buttons, keys, triggers, support structures, etc.), rotationally adjustable input elements (e.g., scroll wheels, knobs, gaming wheels and/or pedals, hinges, etc.), or the like. A magnetic field in an EPM assembly can be shut off in a similar manner, as well as different levels of magnetic intensity by varying the current pulse and amplitude, as would be appreciated by one of ordinary skill in the art with the benefit of this disclosure.

Figure 5:
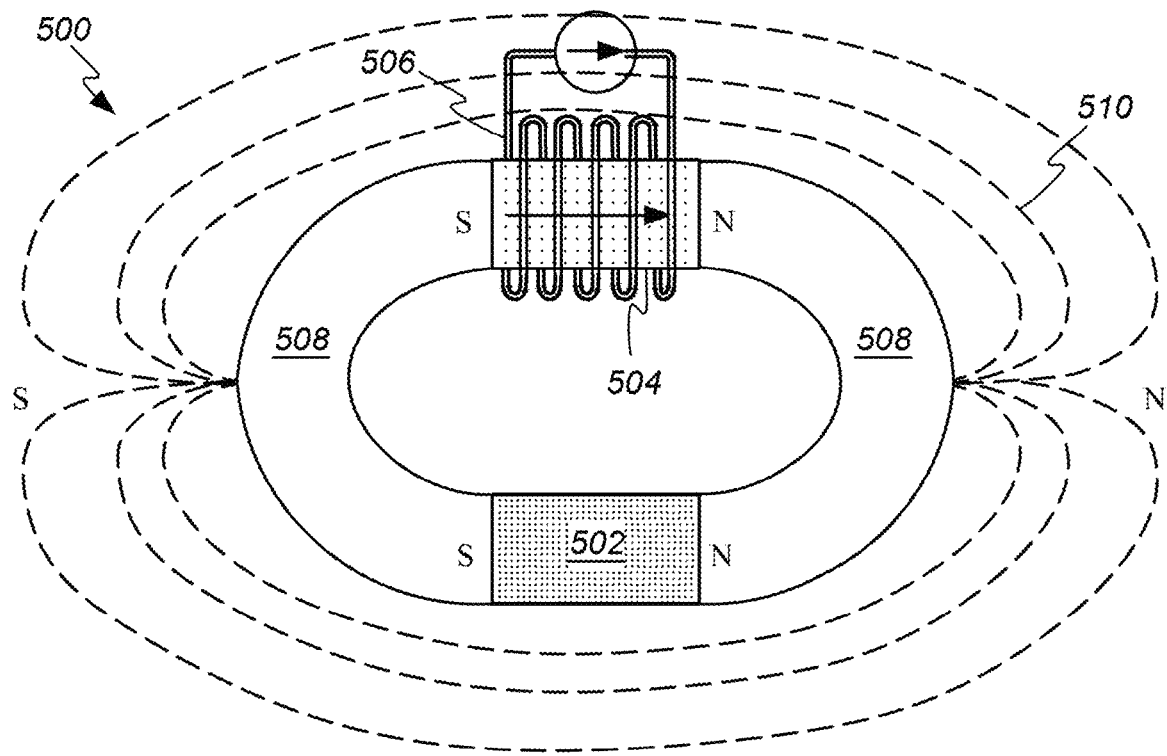
FIG. 5 shows an example of an electro-permanent magnet system operating in a first mode of operation, according to certain embodiments.
Figure 6:
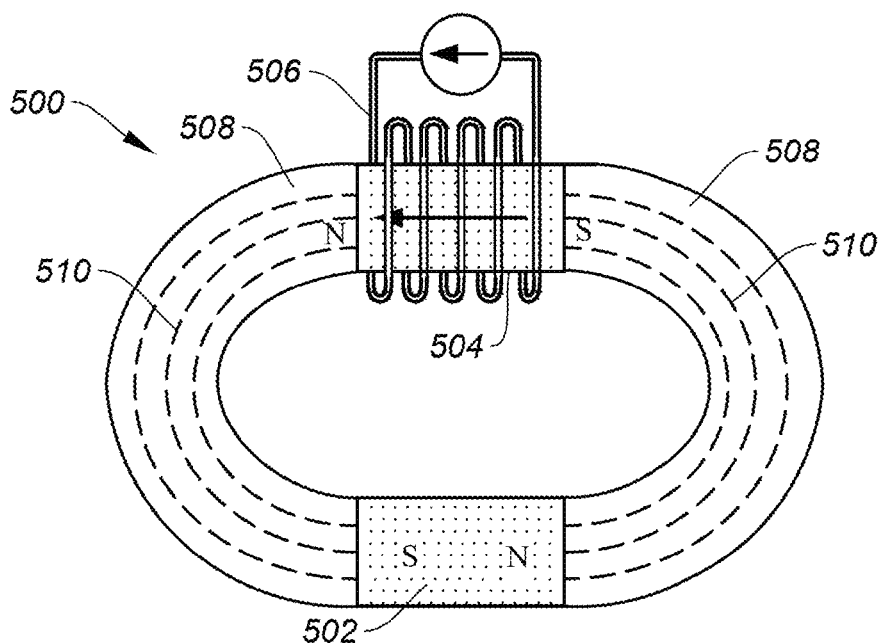
FIG. 6 shows an example of the electro-permanent magnet system operating in a second mode of operation, according to certain embodiments.

FIGS. 5-6 show an example of a simplified electro-permanent magnet system 500 that utilizes two magnets rather than one as is used in many of the embodiments described herein, however the operational principles are the same as would be appreciated by one of ordinary skill in the art with the benefit of this disclosure. In the particular simplified embodiments of FIGS. 5 and 6, electro-permanent magnet 500 includes a first permanent magnet 502 and a second permanent magnet 504. First permanent magnet 502 can have a higher intrinsic coercivity than second permanent magnet 504. In some embodiments, as described above, permanent magnet 502 can take the form of a rare earth (e.g., Neodymium Iron Boron or Samarium Cobalt) magnet and second permanent magnet 504 can take the form of a ferromagnetic (e.g., Alnico or ferrite) magnet. The lower intrinsic coercivity of second permanent magnet 504 allows for a magnetizing coil 506 to emit a magnetic field of sufficient strength to reverse a polarity of the magnetic field emitted by second permanent magnet 504 without affecting the magnetization of first permanent magnet 502. For example, in some embodiments, an intrinsic coercivity of first permanent magnet 502 can be over ten times greater than an intrinsic coercivity of second permanent magnet 504. The lower intrinsic coercivity of second permanent magnet 504 also reduces the amount of electrical energy needed to flip the polarity of second permanent magnet 504, thereby allowing for more efficient operation of electro-permanent magnet 500. First permanent magnet 502 and second permanent magnet 504 are each positioned between and in direct contact or at least close contact with ferromagnetic poles 508. Ferromagnetic poles 508 can be formed from a ferritic material such as mild steel, having an even lower intrinsic coercivity than second permanent magnet 504. Ferromagnetic poles 508 helps guide the magnetic fields emitted by first permanent magnet 502 and second permanent magnet 504. In some embodiments a size and shape of ferromagnetic poles 508 can be adjusted to produce a magnetic field having a desired size and shape. It should be noted that other materials can be used for the EPM cores that are not expressly presented here, provided that said materials provide the same or similar operational characteristics described throughout the present disclosure. In some aspects, EPM cores can be comprised of NdFeB and CoCrC, the latter being the material that can have its magnetic field modulated by coil of the EPM core.

FIG. 5 shows dashed lines 508 depicting a magnetic flux emitted by electro-permanent magnet 500 that show how with both first and second permanent magnets 502 and 504 oriented in the same direction, magnetic flux is released from electro-permanent magnet 500 to create well defined north and south poles. This magnetic field is symmetrical, as depicted, when the strengths of the magnetic fields emitted by the two permanent magnets are about the same.

FIG. 6 shows how when the polarity of first permanent magnet 502 is opposite the polarity of second permanent magnet 504, the magnetic flux generated by both permanent magnets remains substantially contained within and circulating through ferromagnetic poles 508, first permanent magnet 502 and second permanent magnet 504. This results in electro-permanent magnet 500 emitting little to no magnetic field. These principles can be applied to the embodiments that follow utilizing a single magnet or multiple magnets in the EPM system.

Embodiments of the EPM System Applied to an Input Element

In certain embodiments, the EPM system can be comprised of aligned permanent magnets and specifically designed ferromagnetic elements. As described above, the permanent magnets may or not be of the same composition. The ferromagnetic elements are typically comprised of a ferromagnetic material. One or more of the magnets of the EPM system can be encircled by an electric coil, as described above, which operates to induce the polarization and alignment to the magnets, including the intensity of the magnetic field surrounding the magnets. One purpose of the ferromagnetic elements is to concentrate the magnetic flux and modify the magnetic field created by the magnets in a specific region where a relative movement among these ferromagnetic elements occurs (e.g., separation of metal plates, as further described below). In some implementations, the magnetic core of the EPM system can be coupled either to the moving key plate or the stationary controller chassis, where the opposite attractive part is assembled to the other. The magnetic force attraction and the change in this magnetic attraction occurs between the two ferromagnetic elements. In such embodiments, a first ferromagnetic element (e.g., first metal plate) can be fixed to the EPM core while the second ferromagnetic element (e.g., second metal plate) can be fixed to another system component. This relative movement between the ferromagnetic elements (e.g., their separation) changes the induced magnetic forces, hence creating a variable attraction force which can be perceived to a user as the magnetic component of a feedback profile on an input element. For referential purposes, the combination of the magnets, coil, and controlling EPM circuitry (e.g., elements that directly contribute to the generation and control of the magnetic field in magnets 720, 730) can be referred to as an EPM core or EPM assembly, and the ferromagnetic elements (e.g., metal plates) are typically referred to herein as being external to or not a part of the EPM assembly for purposes of distinction, however some embodiments may incorporate the ferromagnetic elements into the EPM assembly in such a manner that could be considered part of the EPM assembly (e.g., one metal plate is integrated with a magnet, the coil, or other aspect of the EPM core). One of ordinary skill in the art with the benefit of this disclosure would appreciate the many modifications, variations, and alternative embodiments thereof. In some implementations, the magnetic field could also be closed through an additional ferrite part (not shown on the drawing) to have a higher concentration of magnetic field and thus allowing a downsizing of the overall module, as would be appreciated by one of ordinary skill in the art with the benefit of this disclosure.

In certain embodiments that employ a separation-type apparatus, the EPM assembly and one metal plate may be attached to the movable parts of the system, such as a moveable, depressible input element (e.g., key plate). The EPM assembly can be assembled at a number of different locations relative to the input element on an input device, as further described below. The second plate may be attached to the chassis of the input device and may remain static. Although many of the embodiments describe metal plates, other materials can be used, such as high-density plastics with metal flakes that have ferromagnetic properties, though they are mostly comprised of plastic.

In some embodiments, the assembly for the separation-type apparatus can be reversed, such that the EPM assembly can be coupled to a static location (e.g., the chassis of the input device) and an individual magnetic plate can be coupled to moving components of the system (e.g., the key plate). In either type of apparatus, the magnetic attraction comes from moving the plates along the magnetic field. In some aspects, the magnetic material (e.g., a rod) moves through the magnetic EPM assembly. That is, a magnetic ring or torus type of assembly having relative movement with respect to the magnetic EPM assembly, as would be appreciated by one of ordinary skill in the art with the benefit of this disclosure.

Figure 7:
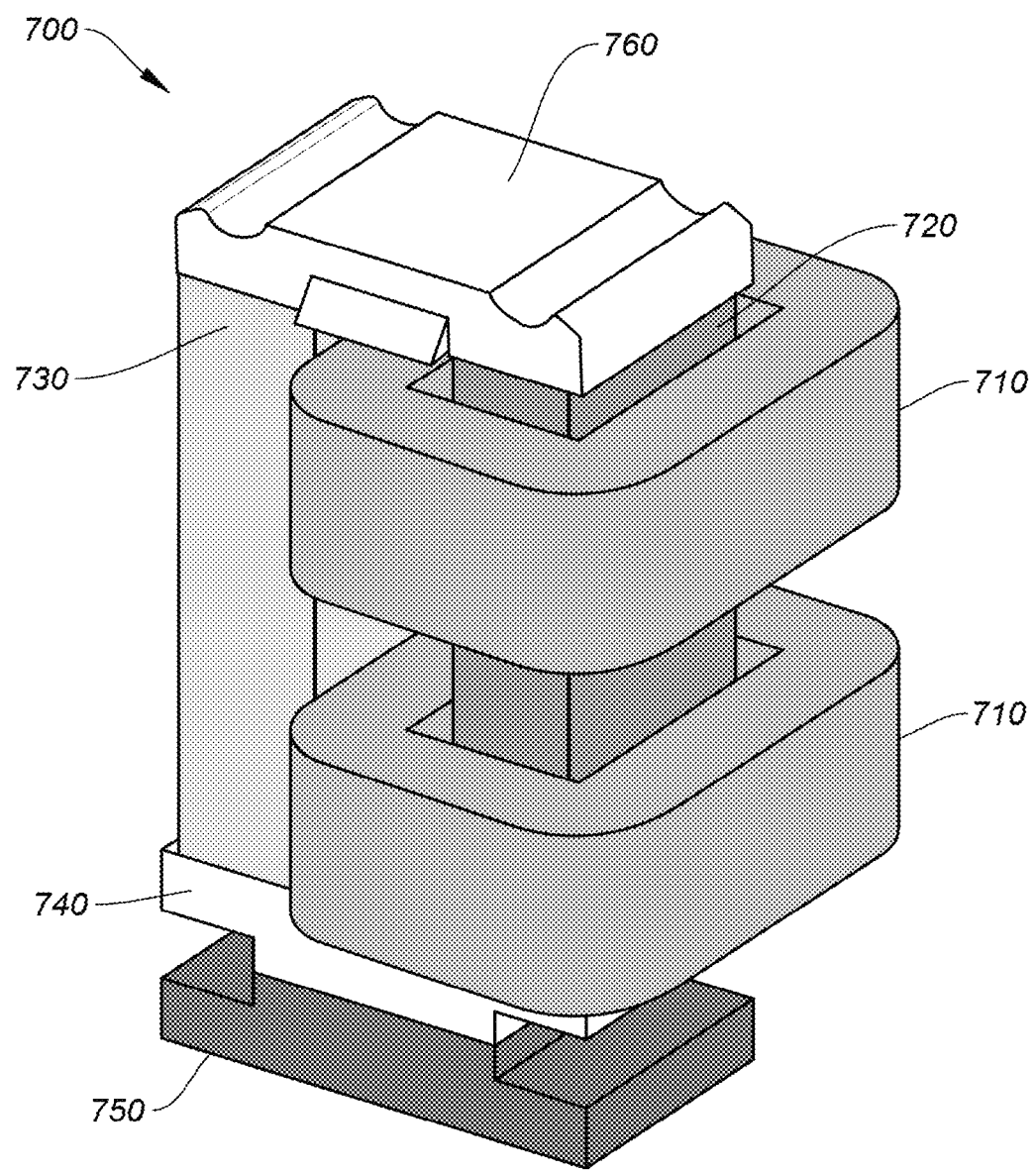
FIG. 7 shows an EPM assembly with ferromagnetic elements configured to move relative to one another, according to certain embodiments.

FIG. 7 shows an EPM assembly 700 with ferromagnetic elements configured to move relative to one another, according to certain embodiments. EPM assembly 700 includes coils 710, magnet 720, magnet 730, first plate 740, and second plate 750. Magnet 730 may be comprised of a material that has a higher coercivity than magnet 720, such that a magnetic field (e.g., intensity and polarity) generated by coils 710 may change the magnetic intensity and polarity of magnet 720 without affecting the magnetic intensity and polarity of magnet 730. For example, magnet 720 may be comprised of CoCrC and magnet 730 may be comprised of NdFeB, which has a higher coercivity than CoCrC. As described above, the magnet that has a stable and fixed magnetic field in the EPM system should have a high coercivity. Some typical materials with high coercivity include Neodymium Iron Boron (NdFeB) and Samarium Cobalt (SmCo). On the other hand, the magnet that is designed to change its magnetic field often in the EPM-based systems described herein should have a low coercivity. Some suitable low coercivity materials that can be used may include Iron Chrome Cobalt (FeCrCo) or AlNiCo. The coercivity is a characteristic that defines the resilience of magnet to have its magnetic field changed by an external field. Generally, a relatively high coercivity is a good choice for a permanent magnet, and a low coercivity is good for the "programmable" electromagnet that changes according to the magnetic field provided by the EPM system coil, as described above.

In some embodiments, coil 710 may include a single set of coils, two coils (as shown) or any suitable amount of coils or coil structures configured around magnet 720. In some cases, a ferromagnetic material may be included with the coils to further enhance the magnetic field generated by coil 720. As described above, an electric current can pass through the coil(s) 710 that causes the coil to generate a magnetic field. The magnetic field can "program" or alter the magnetic field of magnet 720, which will be maintained when the current is turned off. An advantage of using an EPM assembly as described herein is that the programming magnetic field can be applied for a very short period of time (e.g., less than 1 ms) to set the magnetic field of magnet 720, thus very low power is consumed during the brief programming period and no power is consumed by the EPM assembly thereafter for magnet 720 to maintain the newly programmed magnetic field. In some implementations, the charge can be provided by one or more charged capacitors, as would be appreciated by one of ordinary skill in the art with the benefit of this disclosure.

Ferromagnetic elements 740 and 750 are configured as a separation-type apparatus, as described above. In certain embodiments, an input element is configured such that when the input element is depressed, one of the ferromagnetic element parts and moves away from the other ferromagnetic element. One or more of the ferromagnetic elements are typically configured within the magnetic field range of the EPM assembly such that when a magnetic field is generated by the EPM assembly, the ferromagnetic elements may be magnetized causing them to be magnetically attracted to each other in proportion to the strength (intensity) of the magnetic field. In application, when a user depresses the input element, the magnetic attraction between the ferromagnetic elements provides an opposing force to that resists the ferromagnetic elements from parting under the depression force on the input element provided by the user. The opposing force creates a force feedback profile that can be similar to aspects of feedback profiles provided by solely mechanical input element structures, but with the benefit of being fully customizable as the magnetic field and corresponding feedback profile provided by the ferromagnetic elements can be set to any value within a range and can be changed nearly instantaneously from a user perspective (e.g., less than 1 ms) for real-time modification, presenting many feedback profile configurations that previously has not been possible (e.g., different feedback profiles for pressing and releasing profiles). In some embodiments, a typical force that can be used for a main key switch is around 60 gf. Some switches can be as high as 300 gf or more. Any suitable type of switch can be used. Note that there is a distinction between the mechanical contribution and the magnetic contribution for overall force feedback. For most of the force range, the main contribution typically comes from the mechanical system (e.g., the non-clicky feedback), while the magnetic system is used to superimpose a click feedback by the force drop resulting from detaching the plates. The force drop at a mouse click, in standard switches, is usually around 10 gf-20 gf for computer mice, however ranges can extend well beyond 20 gf (e.g., 100 gf) for computer mice or for other input devices, as would be appreciated by one of ordinary skill in the art with the benefit of this disclosure. Furthermore, EPM-based embodiments are not subject to the same wear-and-tear longevity issues that solely mechanical embodiments are subject to, and power requirements for implementing said EPM-based feedback profiles are often negligible (e.g., 0.1 J-0.2 J) for typical charge storage devices (e.g., batteries) for input devices.

In certain embodiments, the ferromagnetic elements can be comprised of any ferromagnetic material, such as a metal, alloy, or the like that are commonly referred to as "soft magnetic materials," which are materials that can exhibit a remnant magnetization which is relatively easy to cancel and control, and are very commonly used in electromagnetic devices (e.g., Fe, FeSi, FeCo, Ferrite, FeNi). When, for instance, both magnets of the EPM system have magnetic polarizations in the same direction, the metal plate that is attached to it may act as a concentrator, so that the full assembly of the electromagnet, permanent magnet, and plate, together operate as a big magnet. The second plate (e.g., typically a soft magnetic materials) is attracted to it.

Figure 8:
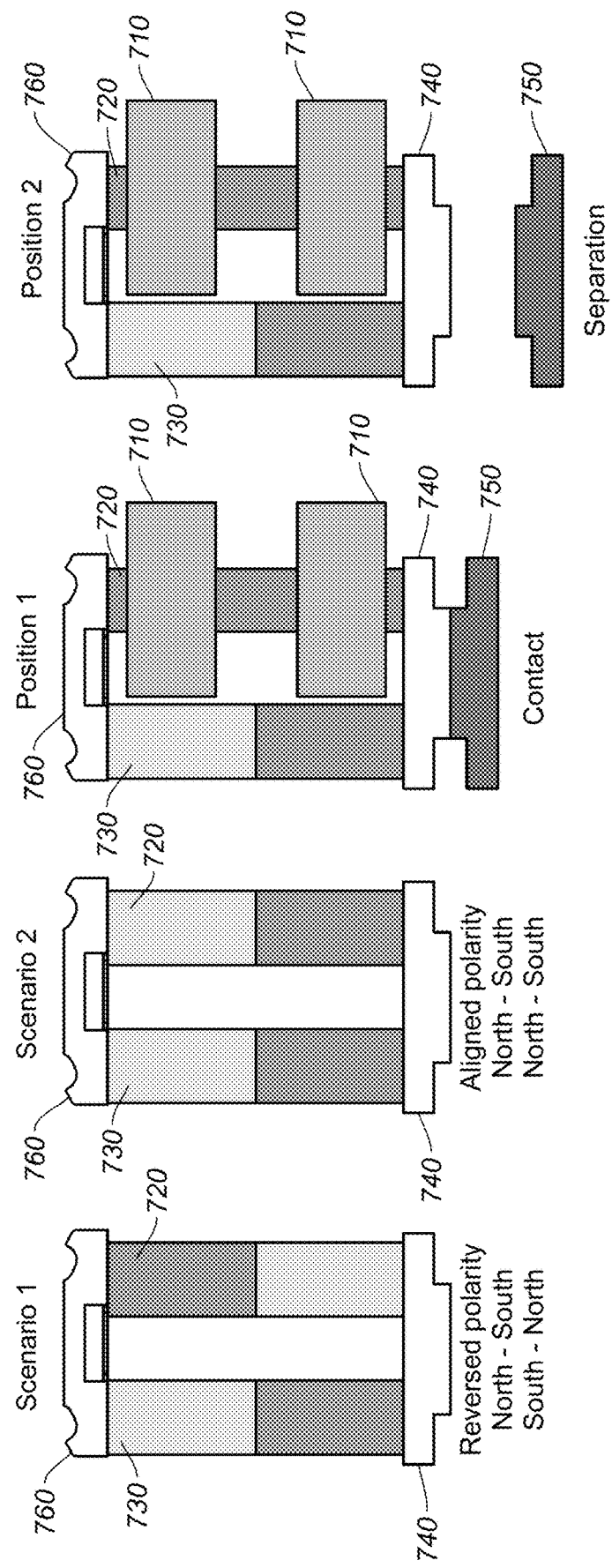
FIG. 8 is a simplified diagram showing how the polarity of the EPM assembly affects the moving ferromagnetic elements, according to certain embodiments.

FIG. 8 is a simplified diagram showing how the polarity of the EPM assembly affects the moving ferromagnetic elements, according to certain embodiments. In scenario 1, the poles of magnets 720, 730 are reversed with their corresponding south and north poles on the top side, respectively, and their north and south poles on the bottom side, respectively, which are coupled to ferromagnetic element 740. In this "off" configuration, the magnetic field generated by magnets 720, and 730 are magnetically attracted to each other (e.g., north pole of magnet 730 is magnetically attracted to the south pole of magnet 720) such that the corresponding magnetic field from one magnet "flows" into the other and a relatively small amount of the magnetic field exits the EPM assembly and thus does not substantially magnetically influence surrounding systems (e.g., magnetic attraction between the plates 720, 730 is low enough where it is imperceptible to a user). In some embodiments, a top plate 160 can be incorporated into the EPM assembly that can operate to help conduct the magnetic field from one magnet to the next in the off configuration. As such, ferromagnetic elements 740 and 750 (e.g., first and second metal plates, respectively) are not magnetically attracted to one another (or not enough to be perceptible to a user) and can move freely from position 1 to position 2 when the input element is depresses without any added magnetic resistance to movement. That is, the ferromagnetic elements are not magnetically attracted to each other and do not magnetically oppose the ferromagnetic elements from parting, as further described below with respect to FIG. 10.

In scenario 2, the poles of magnets 720, 730 are aligned with their corresponding north poles on the top side, and their south poles on the bottom side. In this "on" configuration, the magnetic fields generated by magnets 720, and 730 go in the same direction and exit the EPM assembly, together operating like a single larger magnet, with the magnetic field circuit closing through the air, further including ferromagnetic elements 740 and 750 in the magnetic circuit (in position 1), thereby magnetizing ferromagnetic elements 740, 750 making them magnetically attracted to each other. The magnetic attraction between ferromagnetic elements 740, 750 magnetically opposes the ferromagnetic elements 740, 750 from parting when a user applies a depression force on the corresponding input element. As noted above, the resistance to parting the ferromagnetic elements changes as the ferromagnetic elements move farther apart because ferromagnetic element 750 moves out of range of the magnetic field and thus the strength of the magnetic attraction between the ferromagnetic elements 740, 750, changes in proportion, such that the feedback profile changes based on the distance of the ferromagnetic elements relative to each other, as further described below. That is, when the magnetic poles are aligned, as in the "on" configuration, magnets repel themselves (e.g., pushing apart to the sides). In the EPM assembly, the magnets are held in place via hardware and the repelling magnetic fields wrap around through the air to the opposite pole (and through the ferromagnetic elements (e.g., metal plates)) to complete the circuit. Together, though they repel each other, in the EPM system the resultant magnetic field is similar to a larger, single magnet, as would be appreciated by one of ordinary skill in the art with the benefit of this disclosure.

Figure 9:
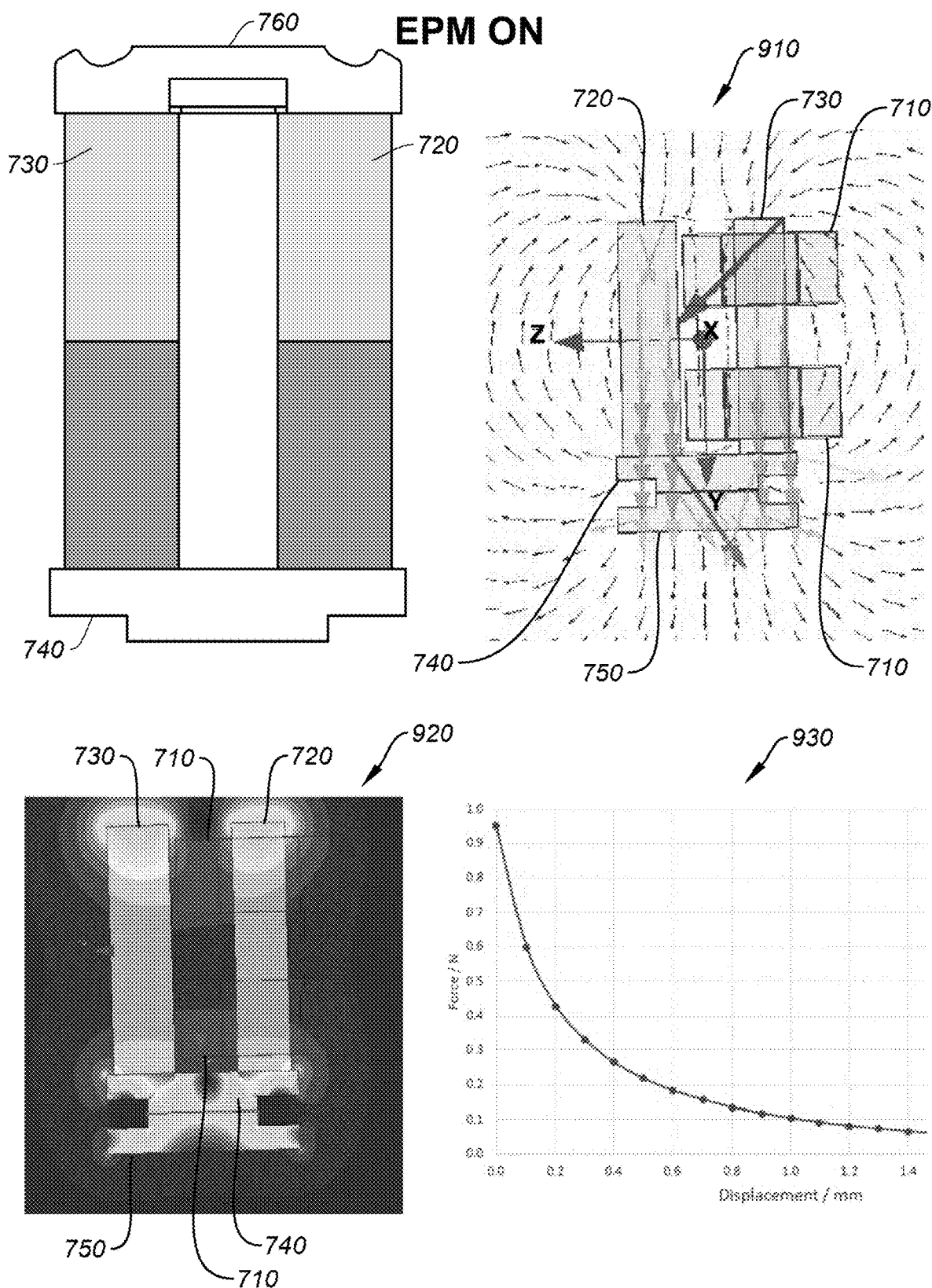
FIG. 9 shows a magnetic field of the EPM assembly when switched on, according to certain embodiments.

FIG. 9 shows a magnetic field of the EPM assembly when switched on, according to certain embodiments. In the "on" configuration, the magnetic field of magnets 720 and 730 emanate outward and around the magnets 720, 730, including ferromagnetic elements 740 and 750 in the magnetic circuit when in position 1 (e.g., ferromagnetic elements 740, 750 are in contact—typically when the corresponding input element is in a neutral, non-pressed state). This magnetizes ferromagnetic elements 740, 750 making them magnetically attracted to each other, thereby creating a feedback profile that changes based on a distance between them. For example, when the ferromagnetic elements are in contact, the attractive force between them is highest. As the ferromagnetic elements move apart, their magnetic attraction reduces. The rate of the reduction of the magnetic attraction based on distance can be proportional, exponential, or another relationship, as would be appreciated by one of ordinary skill in the art with the benefit of this disclosure. Image 910 shows a simplified representation of a magnetic field for an EPM assembly with aligned magnetic poles, according to certain embodiments. Image 920 shows a simulation of a corresponding magnetic field, which shows how the magnetic fields pass through and magnetize ferromagnetic elements 740, 750. Graph 930 depicts force vs. displacement, where the force corresponds to an amount of force (N) required to depress the corresponding input element (e.g., the force profile) and the displacement corresponds to amount of distance (mm) that the ferromagnetic elements part. The amount of force decreases at a decreasing rate as the ferromagnetic elements move farther apart from one another. For instance, in position 1 the force required to part the ferromagnetic element is about 0.95 N and roughly 0.43 N when the ferromagnetic elements are 0.2 mm apart, 0.28 N at 0.4 mm, 0.2 N at 0.6 mm, and continues to decrease at a decreasing rate as the ferromagnetic elements approach position 2. Though not necessarily presented in the graph, some other contributors to the force curve may include mechanical components (e.g., a biasing spring), physical characteristics of the input element (e.g., key deformation/flexion), preload systems, or the like.

Figure 10:
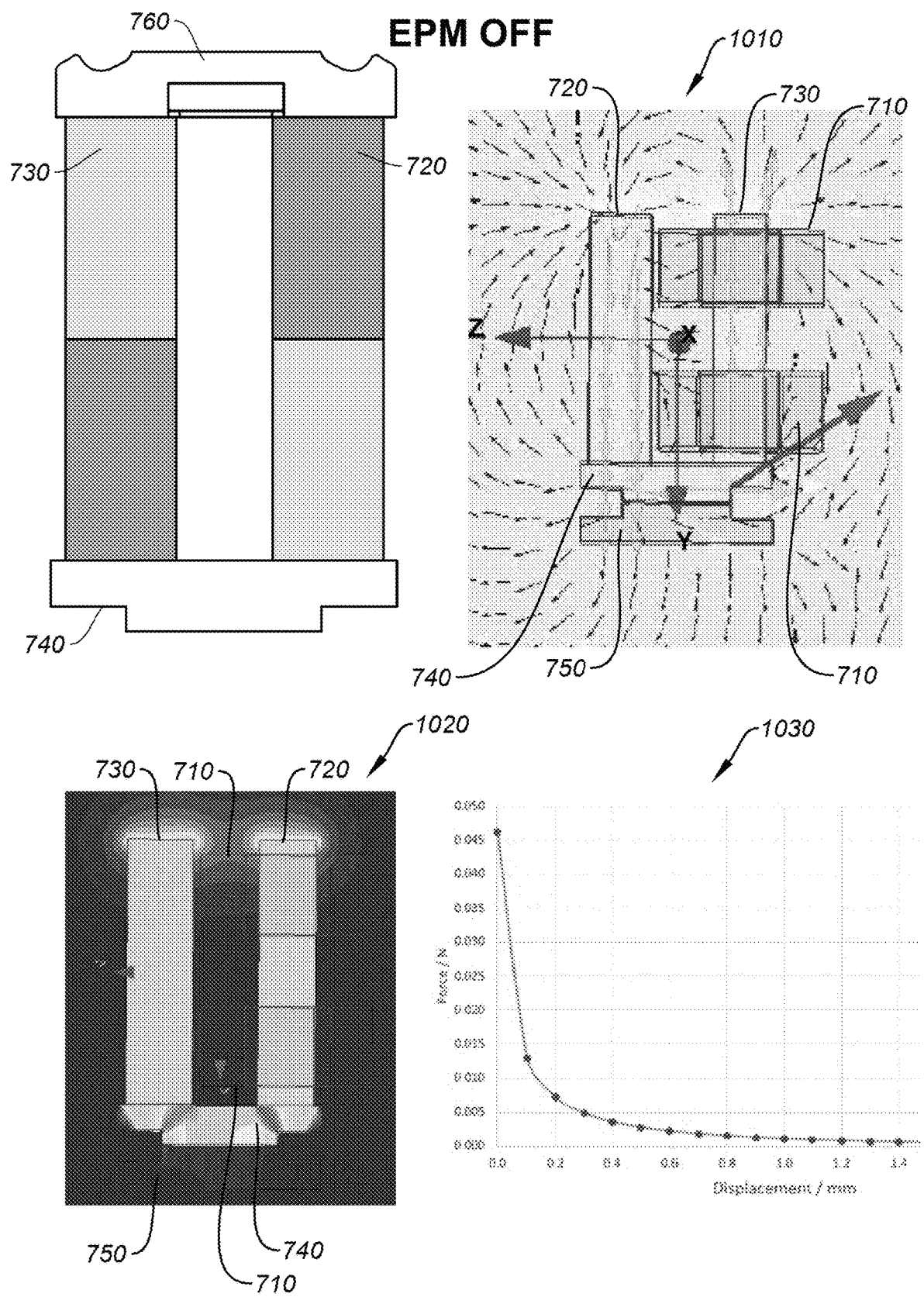
FIG. 10 shows a magnetic field of the EPM assembly when switched off, according to certain embodiments.

FIG. 10 shows a magnetic field of the EPM assembly when switched off, according to certain embodiments. In the "off" configuration, the magnetic field of magnets 720 and 730 are magnetically attracted to one another such that the corresponding magnetic fields are largely contained within the magnets themselves and does not appreciably magnetize ferromagnetic elements 740, 750. As such, ferromagnetic elements 740 and 750 (e.g., first and second metal plates, respectively) are not strongly magnetically attracted to one another and can more easily move from position 1 to position 2 when the input element is depressed without any added significant magnetic resistance to movement. That is, the ferromagnetic elements are not magnetically attracted to each other (no substantial residual magnetic attraction) and do not substantially magnetically oppose the ferromagnetic elements from parting. Image 1010 shows a simplified representation of a magnetic field for an EPM assembly with opposite (reversed) magnetic poles, according to certain embodiments. Image 1020 shows a simulation of a corresponding magnetic field, which shows how the magnetic fields do not pass through and magnetize ferromagnetic elements 740, 750, at least not to a degree that would be detectable to a user as a resistance to depressing the corresponding input device. This is depicted in graph 1030, which plots force (N) vs. displacement (mm), similar to graph 930 of FIG. 9. In contrast to graph 930, the amount of force needed to part the ferromagnetic elements is very low— roughly 0.45 N at position 1, and the force profile drops precipitously thereafter to about 0.0057 N at 0.2 mm, 0.004 N at 0.4 mm, and 0.003 at 0.6 mm and so on. In some cases, as shown in graph 1030, a small magnetic attraction force may remain as the magnetic fields are not cancelling each other exactly (e.g., some cases less than 1 gf), though the decrease in attraction force is still substantial—approximately a 20× factor, as shown. At maximum polarization, magnetic attraction of 80 gf or more are possible. Having different sized/shaped/configured ferromagnetic elements can be used to "shape" the click UX to change the "sharpness" of the click, or other click characterizations, as would be appreciated by one of ordinary skill in the art with the benefit of this disclosure.

Figure 11:
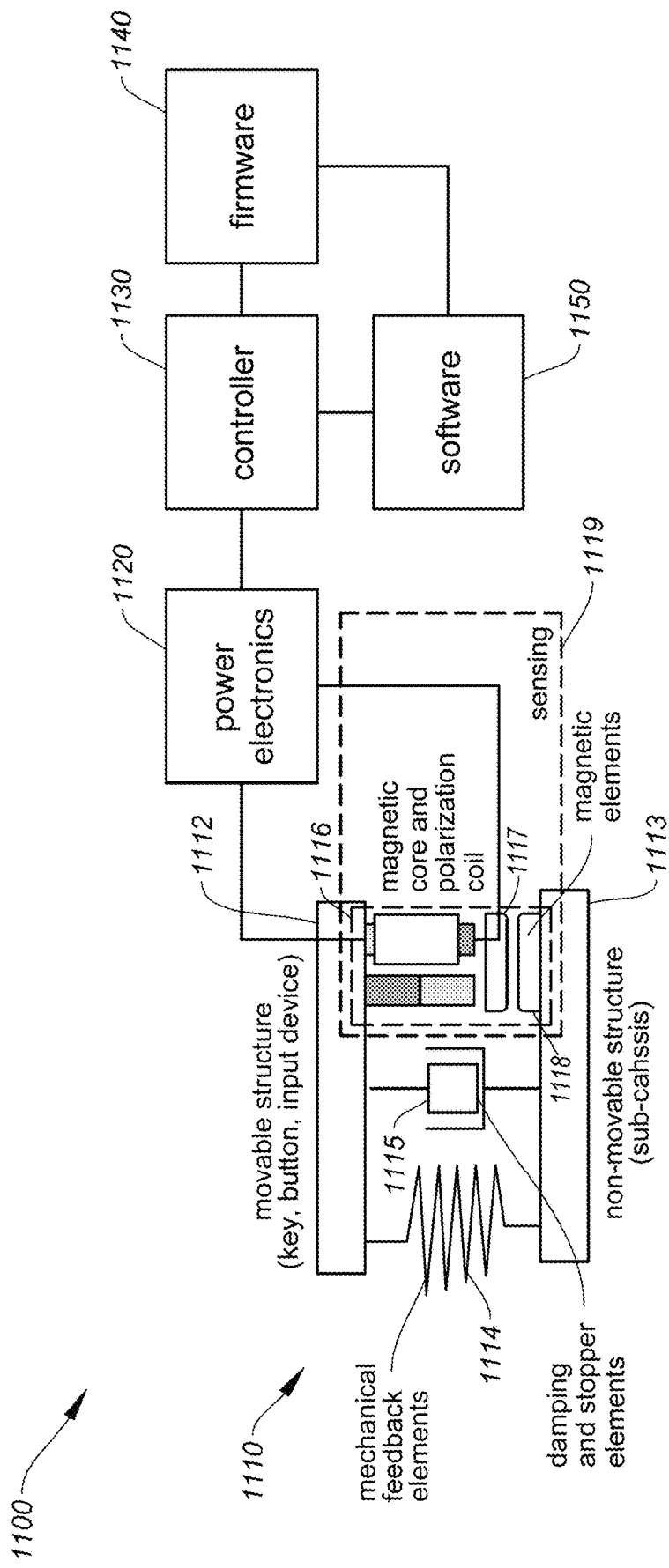
FIG. 11 shows a simplified block diagram of a control system for an EPM system for an input device, according to certain embodiments.

FIG. 11 shows a simplified block diagram of a control system 1100 for an EPM system of an input device, according to certain embodiments. Control system 1100 can be used to control the magnetic field generated by the EPM assembly. Control system 1100 can include a moveable structure (e.g., key, button, input element) 1112, a non-movable structure 1113 (e.g., input device chassis or sub-chassis), mechanical feedback element(s) 1114, damping and/or stopper element(s) 1115, magnetic core and polarization coil 1116 (e.g., EPM assembly), top ferromagnetic element 1117, bottom ferromagnetic element 1118, power electronics block 1120, controller block 1130, firmware 1140, and software 1150. Control system 1100 may incorporate more or fewer components shown in FIG. 11. For example, some embodiments may not include software, some may not incorporate mechanical feedback elements, or the like. One of ordinary skill in the art with the benefit of this disclosure would appreciate the many modifications, variations, and alternative embodiments thereof.

In certain embodiments, movable structure 1112 can correspond to an input element, which may be a button on a computer mouse, a key on a keyboard, or other suitable depressible input element that could incorporate the EPM assembly concepts described herein, as would be appreciated by one of ordinary skill in the art with the benefit of this disclosure. Movable structure 112 can include the user accessible portion of the input element (e.g., portion of a key plate pressed by a user) as well as portions inaccessible, such as portions coupled to a hinge or pivot structure (see, e.g., FIG. 12), other biasing elements (e.g., springs), or the like. In some embodiments, the movable structure may be coupled to one of the ferromagnetic elements 1117 such that as the movable structure is moved (e.g., key is depressed), the corresponding ferromagnetic element is also moved. Typically, the ferromagnetic elements are in contact with each other or in a closest position relative to each other when the movable structure is at rest, and the ferromagnetic elements are farthest apart from each other when the movable element is depressed at a maximum deflection. In some embodiments, the ferromagnetic elements may move in proportion to the deflection of the movable structure. In some cases, the movement of the ferromagnetic elements may not be proportional to deflection. For instance, the ferromagnetic elements may only move apart over a portion of the total range of deflection of the movable element and stop moving apart once the movable element continues to move beyond the portion of the total range. In some aspects, the configuration can be flipped such that the movable structure may be coupled to the other ferromagnetic element 1118. Some embodiments may be configured such that the plates are separated when at rest and closes during motion.

Figure 14:
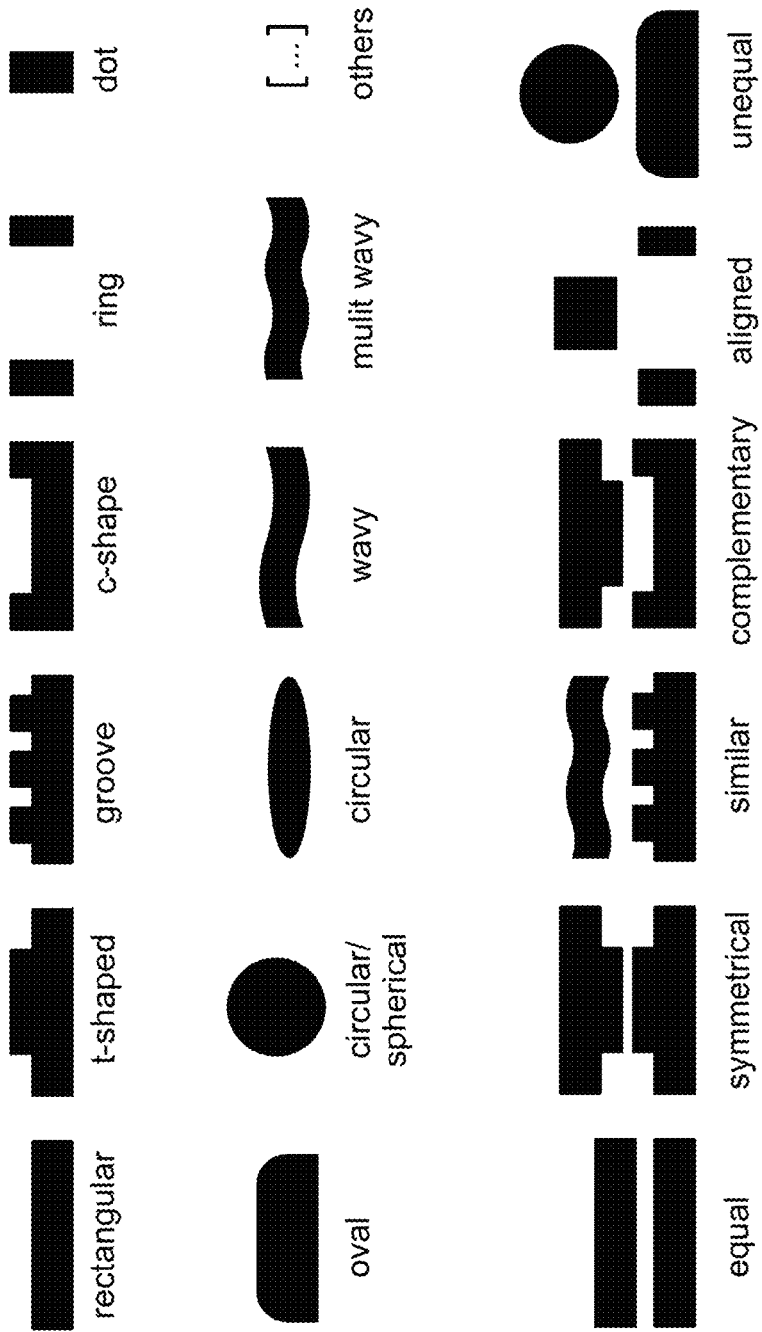
FIG. 14 shows a number of ferromagnetic element types and configurations thereof, according to certain embodiments.

Note that the movable elements do not necessarily have to be move perpendicularly to the fixed element. It is possible to have a tangential motion, as shown in FIG. 14, with T-shaped (flat-to-flat) and groove type plates are mixed with complementary shapes (U-shaped). One of ordinary skill in the art with the benefit of this disclosure would appreciate the many modifications, variations, and alternative embodiments thereof.

In some embodiments, the non-movable structure 1113 can be any suitable structure that is not designed to be articulable, such as a chassis, sub-chassis, printed circuit board, or the like. Mechanical feedback element(s) 1114 may include a biasing element (e.g., spring(s)) that can further define the feedback profile of the input element. In some aspects, damping elements can reduce vibration or soften impacts at the beginning (e.g., where the ferromagnetic elements coupled) or the end (e.g., where the ferromagnetic elements at full displacement relative to each other) of the range of motion for the input element. Stopper element(s) 1115 may establish end points for a range of motion for the input element. The magnetic core and polarization coil 1116 (e.g., EPM assembly) can be configured as a single core, multiple cores, with multiple coils, etc., as would be appreciated by one of ordinary skill in the art with the benefit of this disclosure. Power electronics block 1120 may be a part of power management block 230 or may be a standalone system. Controller block may be a part of processor(s) 210 and/or 302, or a standalone entity. Firmware 1140 and software 1150 may be incorporated into memory 220, memory subsystem 306, a combination thereof, or as standalone entities. Some elements are not shown to prevent obfuscation of some of the novel concepts described herein, but should be considered as part of the EPM control system 1100 where applicable. For instance, a sensing module 1119 may be included to detect closing and/or opening of the ferromagnetic elements. The sensor can be controlled by the controller 1130, firmware 1140, software 1150, another element on board or off-board the corresponding input device, or a combination thereof. In such embodiments, the sensing module 1119 may be controlled by firmware communicatively coupled between controller 1130, sending module 1119, and software 1150. One of ordinary skill in the art with the benefit of this disclosure would appreciate the many modifications, variations, and alternative embodiments thereof.

Implementation of EPM Assembly on Computer Mouse Key Plate

The various embodiments of EPM assemblies described herein can be implemented in any suitable input device, with non-limiting embodiments shown and described in the examples presented herein. Some types of input elements with traditional electro-mechanical switches include hinge keys and pivot keys. In computer mice, hinge keys are typically fixed to the mouse structure at the back. Its front movement, under the fingertip, is typically achieved by elastic deformation of an integrated flexible feature, the hinge. The hinge is often designed to introduce enough stiffness to the input element to support the key plate weight and additional stiffness. While hinge-based designs typically have little lateral movement, they are still prone to torsional flexing. Being an elastic element, hinged key plates are also prone to vibrations and resonances that can impact the click. Hinge-based input elements may be further preloaded in the front. Left and right input elements (e.g., the main left/right buttons on a computer mouse) can either be independent plastic elements or a single element with a dividing slot separating them. In hinge implementations, the EPM assembly could be configured on the front of the mouse, as shown in FIG. 13A.

Input elements using pivot key structures are often used in high-end gaming mice, for example, and include a single degree of freedom, rotation around pivot axis, constrained by the surround input device structure (e.g., the other components within the computer mouse), with a preloaded spring on the back. Pivot key structures include the pivot—a low friction element—that provides structural rigidity, and reduced lateral (swipe) and torsional key movements. The pivot can acts as a bearing rather than an elastic element. In some conventional designs, the back spring may introduce resonances on the structure. In some embodiments that do not incorporate a micro-switch configured to push the key plate back up with a restoring force, a biasing mechanism can be configured in the back or in the front, or a torsional spring can be included in the pivot mechanism itself. Any suitable mechanism can be used for provide a mechanical restoring force, as would be appreciated by one of ordinary skill in the art with the benefit of this disclosure.

Figure 12:
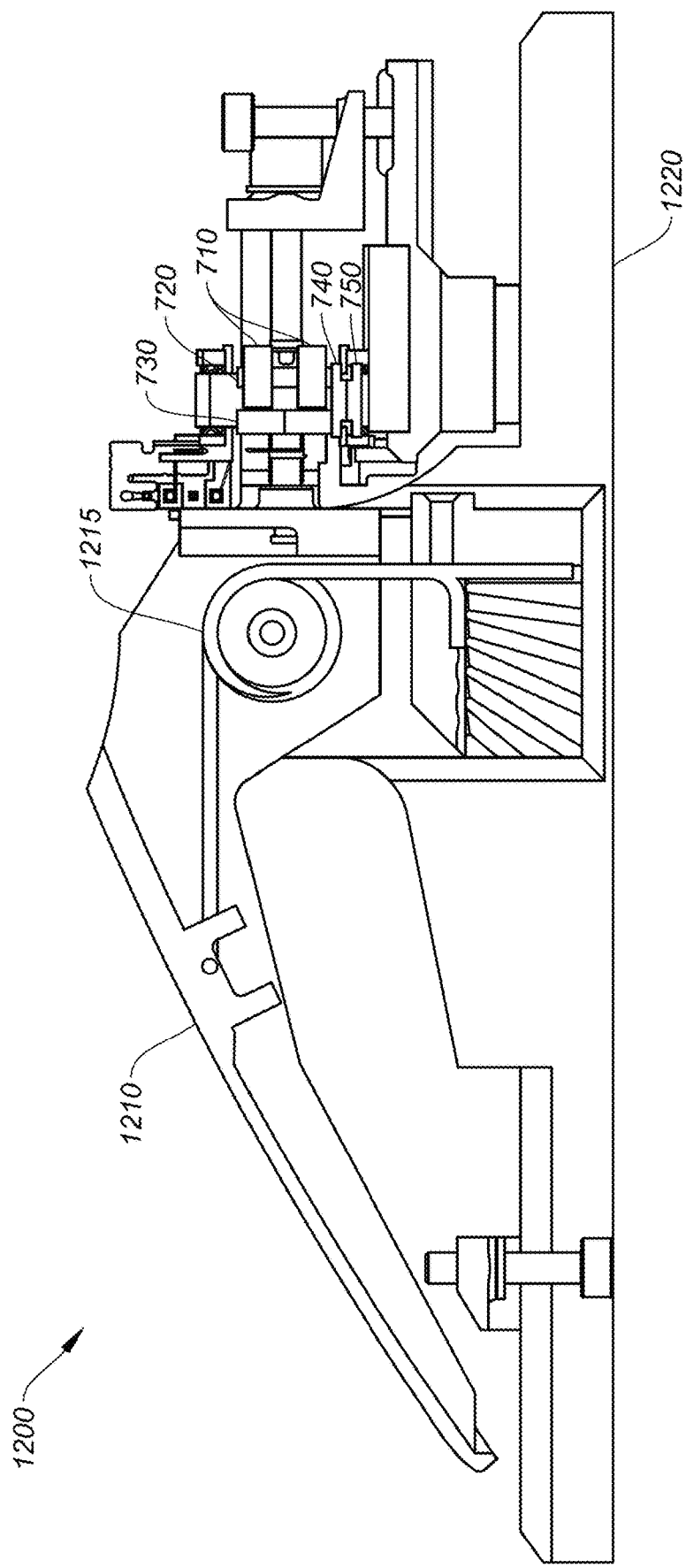
FIG. 12 shows an EPM system configured on a back end of a key plate assembly, according to certain embodiments.

The EPM assembly 700 can be coupled to a pivot key structure at any suitable point. FIG. 12 shows an EPM system configured on a back end of a key plate assembly, according to certain embodiments. The key plate 1210 rotates on a pivot with a preload biasing mechanism 1215. The EPM system 700 includes ferromagnetic elements 740, 750 where ferromagnetic element 740 is coupled to the EPM assembly and parts from ferromagnetic element 750 when key plate 1210 is depressed. Ferromagnetic element 750 may be coupled to a fixed location, such as chassis 1220, a sub-chassis, PCB, or the like.

Figure 13A:
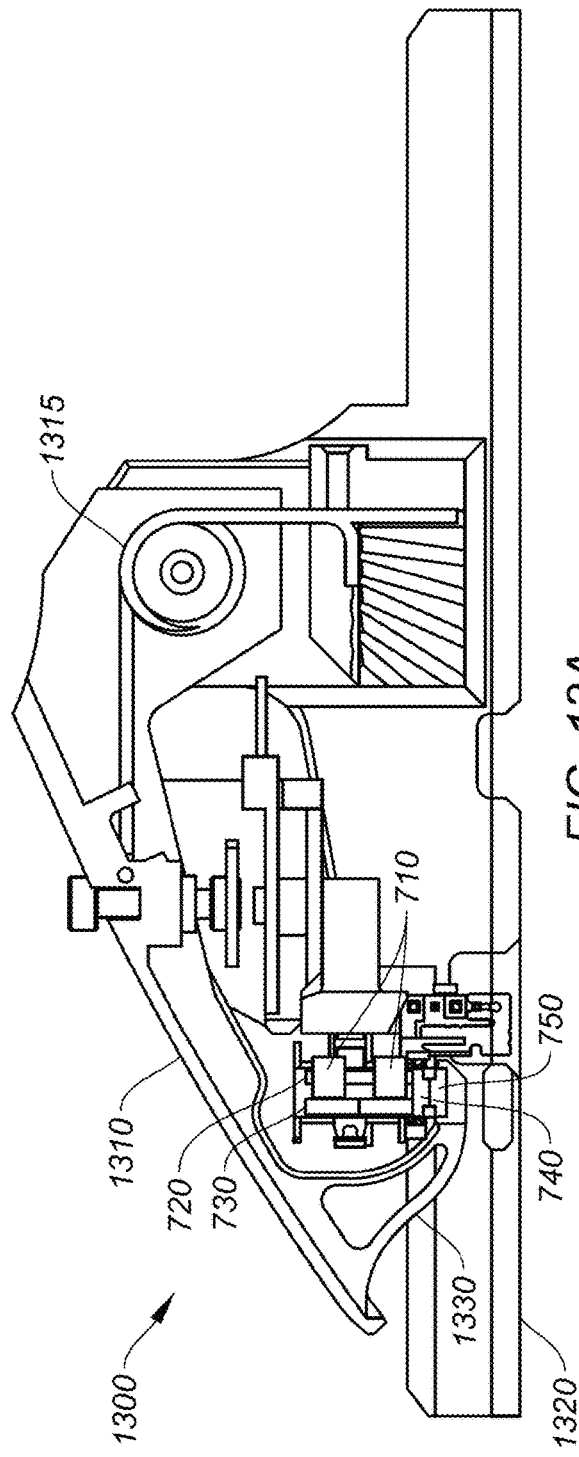
FIG. 13A shows an EPM system configured on a front end of the key plate assembly, according to certain embodiments.
Figure 13B:
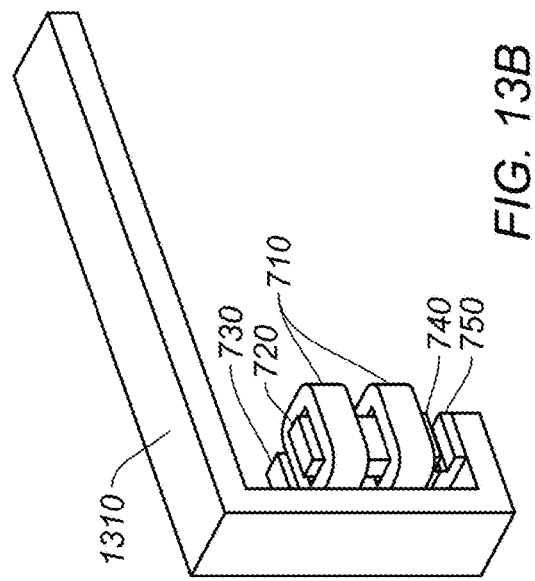
FIG. 13B shows a close up of the relationship between the EPM assembly and key plate in a front-end-based system; according to certain embodiments.

FIG. 13A shows an EPM system configured on a front end of the key plate assembly, according to certain embodiments. In this example, the EPM assembly and top ferromagnetic element 740 is coupled to a fixed location, such as chassis 1320, a sub-chassis, PCB, or the like. The bottom ferromagnetic element 750 is coupled to the key plate 1310 (the movable element) and moves away from top ferromagnetic element 740 as key plate 1310 is depressed. A close-up of the relationship between the EPM assembly, the ferromagnetic elements 740, 750, and key plate 1310 is shown in FIG. 13B. In some aspects, element 1330 can be used for turning the overall feedback profile. Its rigidity or stiffness can be adjusted to introduce more or less travel at the key plate before detaching the plates and thus can affect operational travel. Element 1330 can operate as a flat spring and can be rigid. Other design configurations are possible as well, as would be appreciated by one of ordinary skill in the art with the benefit of this disclosure.

In some keyboard implementations, a keyboard switch may include a push-button with single degree of freedom for a vertical displacement. Each of these examples of input element structures, as well as those within the wide purview of the present application, can incorporate the novel EPM systems described herein, as would be appreciated by one of ordinary skill in the art with the benefit of this disclosure.

In some exemplary embodiments, an input device can include one or more processors; a mechanically depressible input element; an electro-permanent magnet (EPM) assembly including: a permanent magnet operable to generate a magnetic field and a magnetizing assembly controlled by the one or more processors and configured to set a strength and polarity of the magnetic field generated by the permanent magnet; a first metal plate (a first ferromagnetic element) coupled to the depressible input element; a second metal plate (a second ferromagnetic element) coupled to the EPM assembly, where the first and second metal plates are configured to be at least partially axially aligned and in contact with each other when the depressible input element is in a neutral, non-depressed state, and where the first metal plate is configured to part and move away from the second metal plate as the depressible input element is depressed. When the EPM assembly magnetizes the permanent magnet to a first polarity, the first and second metal plates can be magnetically attracted to each other and provide an attracting force in proportion to the strength of the magnetic field that magnetically opposes the first and second metal plates from parting. When the EPM assembly magnetizes the permanent magnet to a second polarity, the first and second metal plates are not magnetically attracted to each other and do not magnetically oppose the first and second metal plates from parting. In some aspects, the input element is flexible and provides a resistance to flexion, and when the EPM assembly magnetizes the permanent magnet to the first polarity and the strength of the magnetic field is greater than the resistance to flexion of the input element, a force imparted on the input element that causes the first and second metal plates to part includes a force magnitude greater than the resistance to flexion and the attracting force of the first and second metal plates.

In some cases, the input element is flexible up to a threshold deflection distance, where the input element is depressible up to a threshold depression distance, the threshold deflection distance being less than the threshold depression distance, and when the EPM assembly magnetizes the permanent magnet to the first polarity and the strength of the magnetic field is greater than the resistance to flexion of the input element, the input element is depressible up to the threshold deflection and stops until the force imparted on the input element is greater than the attracting force thereby causing the first and second metal plates to part and cause the input element to continue depressing up to the threshold depression distance. In some aspects, the first and second plates are configured to move apart up to 0.2 mm to 0.5 mm, although other ranges are possible. The threshold depression distance for the input element may be 0.5 mm to 0.7 mm, although other ranges are possible. Not that the flexibility can be important as it provides some of key plate travel before the "click" feeling happens. This is provided so the user to have a good sensation on when the actual click will happen. Note that the sharpness of the click itself—that is how sudden the force drop is in travel, which can be important for the user experience, may be related to how far the plates need to move until they are no longer under the effect of the magnetic field. In some embodiments, magnetic click occurs in less than 0.1 mm (e.g., a very sharp click) and in some cases less than 0.05 mm, although other distances can be used.

In certain embodiments, the input element is a key plate that includes a front user-accessible portion having a top surface and a bottom surface, a pivot support portion, a rear portion including a bottom surface, and a shaft disposed in the pivot support portion, wherein the key plate rotates with respect to the shaft. In some aspects, the EPM assembly, first metal plate, and second metal plate are configured on the rear portion of the key plate. In some cases, the EPM assembly, first metal plate, and second metal plate are configured on the front user-accessible portion of the key plate.

In further embodiments, and as further described below, the input device can further include a Hall Effect Sensor configured to detect a change in a magnetic flux of the magnetic field of the EPM assembly, where the one or more processors are further configured to generate a control signal corresponding to a depression of the input element by a threshold distance when the magnetic flux changes by a threshold amount. The input device can be a computer mouse, keyboard, or the like. The magnetizing assembly may include a magnetic core and polarization coil, as shown for example in FIG. 7.

In further embodiments, when the EPM assembly magnetizes the permanent magnet to the first polarity, a first magnetic circuit is formed that passes through the first and second metal plates (ferromagnetic elements), and when the EPM assembly magnetizes the permanent magnet to the second polarity, a second magnetic circuit is formed within the EPM assembly that only passes through the first metal plate. In some embodiments, when the EPM assembly magnetizes the permanent magnet to the first polarity, the magnetizing assembly and permanent magnet have matching magnetic poles, and when the EPM assembly magnetizes the permanent magnet to the second polarity, the magnetizing assembly and permanent magnet have opposing magnetic poles that form a closed magnetic circuit within the EPM assembly.

The various embodiments of the ferromagnetic elements presented herein depict them as generally t-shaped with flat interfaces between them. However, other designs of ferromagnetic elements are possible and can be used to generate different feedback profile characteristics as the ferromagnetic elements move relative to one another. Some design considerations that can affect how they perform when exposed to a magnetic field include, but are not limited to, magnet composition and grade; magnet geometry; magnet individual size; magnets relative position to each other and to the EPM assembly and corresponding magnetic field, stator material (magnetic properties; stator size, overall geometry and particular shape, ferromagnetic element's size, overall geometry and particular shape; in some cases the moving plate can be also comprised of ferrite such that they conduct a magnetic field but do not necessarily stay magnetized. The ferromagnetic elements can assume any shape, being square, rectangular, oval, profile, etc., and elements of equal, symmetrical, similar or different shape can be paired. FIG. 14 shows a number of ferromagnetic element types and configurations thereof, according to certain embodiments.

Other design characteristics can include a ferromagnetic element initial resting position (e.g., contact, initial separation, air gap); ferromagnetic element total travel distance and final position; elements can move relative to each other (e.g., separate from contact/resting position) or can pass close or through each other (e.g., ring+dot in the aligned type); damping and spacer materials can be configured in-between ferromagnetic elements; coil sizing around reversible magnets; magnet polarization (e.g., polarity and polarization intensity); polarization current modulation (e.g., voltage, current, duration, attack/decay, etc.).

Figure 15:
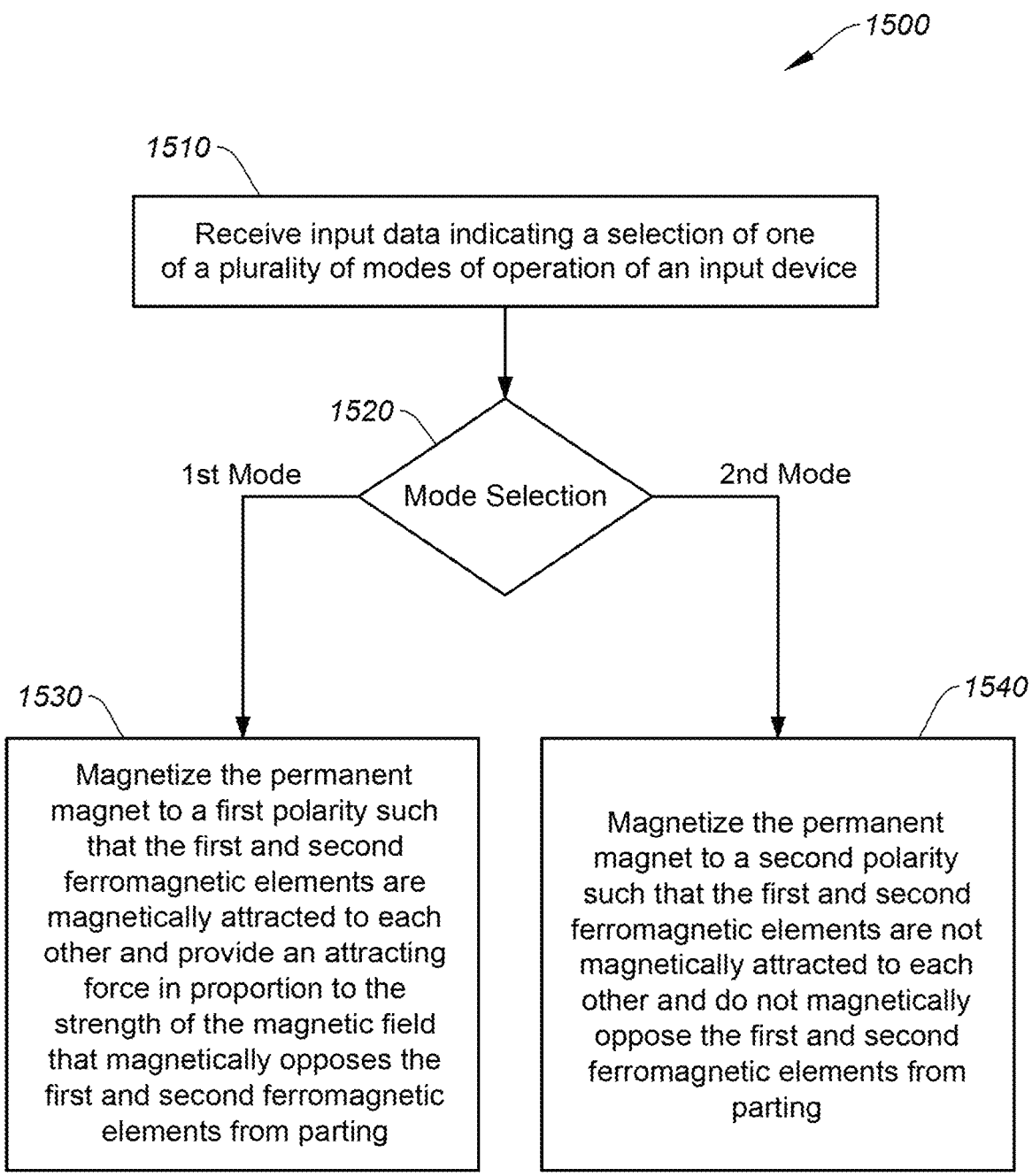
FIG. 15 is a flow chart of a method for controlling a magnetic field of an EPM system for an input device, according to certain embodiments.

FIG. 15 is a simplified flow chart showing aspects of a method 1500 for controlling a magnetic field of an EPM system for an input device, according to certain embodiments. Method 1500 can be performed by processing logic that may comprise hardware (circuitry, dedicated logic, etc.), software operating on appropriate hardware (such as a general purpose computing system or a dedicated machine), firmware (embedded software), or any combination thereof. In certain embodiments, method 1500 can be performed by aspects of system 200 (e.g., processor 210), system 300 (processor 302), control system 1100 (e.g., controller block 1130), or a combination thereof.

At operation 1510, method 1500 can include receiving, by one or more processors, input data indicating a selection of one of a plurality of modes of operation of an input device, according to certain embodiments. The input device may include an input element (e.g., key plate on a computer mouse, key on a keyboard, etc.) and an EPM assembly with a permanent magnet operable to generate a magnetic field and a magnetizing assembly configured to set a strength and polarity of the magnetic field generated by the permanent magnet. The input device can further include a first ferromagnetic element (e.g., metal plate, ferromagnetic material) coupled to the input element and a second ferromagnetic element (e.g., metal plate, ferromagnetic material) coupled to the EPM assembly. In some aspects, the first and second ferromagnetic elements are configured to be at least partially axially aligned and in contact with each other when the input element is in a neutral, non-depressed state. The first ferromagnetic element can be configured to part and move away from the second ferromagnetic element as the input element is depressed, as shown and described above at least with respect to FIGS. 7-13B.

At operation 1530, in response to the received input data corresponding to the selection of a first mode of operation (operation 1520) of the plurality of modes of operation, method 1500 can include magnetizing the permanent magnet to a first polarity such that the first and second ferromagnetic elements are magnetically attracted to each other and provide an attracting force in proportion to the strength of the magnetic field that magnetically opposes the first and second ferromagnetic elements from parting.

At operation 1540, in response to the received input data corresponding to the selection of a second mode of operation (operation 1520) of the plurality of modes of operation, method 1500 can include magnetizing the permanent magnet to a second polarity such that the first and second ferromagnetic elements are not magnetically attracted to each other and do not magnetically oppose the first and second ferromagnetic elements from parting. In some cases, there can be negligible magnetic attraction in the second mode of operation that would not materially affect the feedback profile from a user perspective. For context, users typically would not detect magnetic attraction below 5 gf. In some cases, a minimum force threshold at a person's fingertip can be about 0.8 mN.

In some embodiments, the depressible input element can be flexible and may provide a resistance to flexion. In such cases, when the EPM assembly magnetizes the permanent magnet to the first polarity and the strength of the magnetic field is greater than the resistance to flexion of the depressible input element, a force imparted on the input element that causes the first and second ferromagnetic elements to part includes a force magnitude greater than the resistance to flexion and the attracting force of the first and second ferromagnetic elements.

In certain embodiments, the input element may be flexible up to a threshold deflection distance the input element may be depressible up to a threshold depression distance. In some typical computer mouse designs, there can be about 0.3 mm of travel before the click. This may include be an amount of flexion designed for before the click happens. Thus, an exemplary range of travel can be 0.2 mm to 0.4 mm, although other ranges are possible, as would be appreciated by one of ordinary skill in the art with the benefit of this disclosure. Typically, the threshold deflection distance is less than the threshold depression distance. In such cases, when the EPM assembly magnetizes the permanent magnet to the first polarity and the strength of the magnetic field is greater than the resistance to flexion of the depressible element, the input element is depressible up to the threshold deflection and stops until the force imparted on the input element is greater than the attracting force thereby causing the first and second ferromagnetic elements to part and cause the depressible element to continue depressing up to the threshold depression distance.

In some embodiments, the input element can be a key plate that includes a front user-accessible portion having a top surface and a bottom surface, a pivot support portion, a rear portion including a bottom surface, a shaft disposed in the pivot support portion, wherein the key plate rotates with respect to the shaft. The EPM assembly, first metal plate, and second metal plate may be configured on the rear portion of the key plate (see, e.g., FIG. 12), or on the front user-accessible portion of the key plate (see, e.g., FIGS. 13A-13B). The input element can be configured on a computer mouse, keyboard, or other input device, as further described above.

It should be appreciated that the specific steps illustrated in FIG. 15 provide a particular method 1500 for controlling a magnetic field of an EPM system for an input device, according to certain embodiments. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

From a user experience, the force profile provided in embodiments using an EPM system as described herein can closely simulate that of a solely mechanical system. For example, the magnetic field generated by the EPM assembly and applied to the ferromagnetic elements can be modulated in real-time to create any desired feedback profile, which is possible because a typical key press takes approximately 20 ms or more, while the EPM system can change the magnetic field via a current pulse in 0.5 ms or less, as described above.

In some embodiments (e.g., input device 1200), when the ferromagnetic elements are magnetized and attracted to each other, a user may impart a small increasing force on the corresponding key plate. The key plate may not move until the force overcomes the attracting force between the ferromagnetic elements, resulting in a sudden drop with the key plate, which can feel like a "snap" or conventional "click" to a user. As noted above, the attractive force between ferromagnetic elements can reduce as the distance between the plates is increased. As the key plate begins returning to a neutral, unpressed state (e.g., via a biasing mechanism), the ferromagnetic element may "snap" back together due (e.g., a "release click") to the increasing magnetic attraction between them. In this example, there is no key travel until the force imparted on the key plate overcomes the attractive force between the ferromagnetic elements.

In some embodiments, the key plate is subject to flexion when a depression force is applied to it. As such, the key plate may have a small displacement even though the ferromagnetic elements are still in contact with each other due to the flexion of the key plate. Once the magnetic attraction between the ferromagnetic elements is overcome, then the key plate displaces further, as described above.

It should be noted that the friction profile afforded by EPM assembly-based embodiments, as described herein, differ from solely mechanical-based implementations not only from the functional capabilities (e.g., mechanical-based typically have a single force profile, while EPM-based embodiments can module the force profile, as noted above), but also in the elements of the system that are subject to translation movement. For example, in conventional mechanical systems with a biasing mechanism like a spring or dome structure the provides a resistance to movement, those structures still undergo some translational movement under increasing force until a threshold force is reached, the biasing mechanism buckles, and the key press occurs. Thus, translational movement in such embodiments occurs due to input element flexion, pre-load elements (e.g., springs, etc.), and the primary resistance structure (e.g., spring, dome, scissor, etc.). In contrast, in embodiments using the novel EPM systems described herein, there is no translational movement caused by the EPM assembly and ferromagnetic elements until the attracting force between the ferromagnetic elements is overcome. There may be some translational movement due to key plate flexion or pre-travel hardware, but not due to the EPM assembly and ferromagnetic elements. This characteristic provides greater control over the feedback profile as there is no inherent pre-travel of the EPM system to account for in designing and dynamically controlling and tuning a feedback response for the input element. This characteristic further provides advantages in manufacturing. For instance, there may be operational tolerances on an underlying switch, which can be accommodated by increasing or decreasing aspects of the feedback profile of the EPM assembly and ferromagnetic elements to mitigate these tolerances.

In some implementations, the EPM assembly and ferromagnetic elements are tuned and configured such that once the moving ferromagnetic element is beyond 0.1-0.2 mm, the strength of the magnetic field drops substantially and does not appreciably influence the feedback profile. Different shapes and configurations of the ferromagnetic elements (as shown in FIG. 14) can have an effect on the operable range that the ferromagnetic elements can move relative to each other.

In further embodiments, when a snap or reverse snap (also referred to herein as the "click") from the ferromagnetic elements occurs, there may be a change in magnetic flux through the EPM assembly, which can be detected via a Hall Effect sensor, or a coil coupled to the EPM assembly. The detected change can be used as a trigger to indicate a button press for the input device. Other methods of detecting a button press may include optical sensors or reed relays, which may detect a button press based on a physical displacement of certain elements of the button system (e.g., the key plate or portions thereof). In some cases, sensing can be employed between the electrical contact available between the metal plates.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter. The various embodiments illustrated and described are provided merely as examples to illustrate various features of the claims. However, features shown and described with respect to any given embodiment are not necessarily limited to the associated embodiment and may be used or combined with other embodiments that are shown and described. Further, the claims are not intended to be limited by any one example embodiment.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, it should be understood that the present disclosure has been presented for purposes of example rather than limitation, and does not preclude inclusion of such modifications, variations, and/or additions to the present subject matter as would be readily apparent to one of ordinary skill in the art. Indeed, the methods and systems described herein may be embodied in a variety of other forms; furthermore, various omissions, substitutions and changes in the form of the methods and systems described herein may be made without departing from the spirit of the present disclosure. The accompanying claims and their equivalents are intended to cover such forms or modifications as would fall within the scope and spirit of the present disclosure.

Although the present disclosure provides certain example embodiments and applications, other embodiments that are apparent to those of ordinary skill in the art, including embodiments which do not provide all of the features and advantages set forth herein, are also within the scope of this disclosure. Accordingly, the scope of the present disclosure is intended to be defined only by reference to the appended claims.

Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical electronic or magnetic quantities within memories, registers, or other information storage devices, transmission devices, or display devices of the computing platform.

The system or systems discussed herein are not limited to any particular hardware architecture or configuration. A computing device can include any suitable arrangement of components that provide a result conditioned on one or more inputs. Suitable computing devices include multi-purpose microprocessor-based computer systems accessing stored software that programs or configures the computing system from a general purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

Conditional language used herein, such as, among others, "can," "could," "might," "may," "e.g.," and the like, unless specifically stated otherwise, or otherwise understood within the context as used, is generally intended to convey that certain examples include, while other examples do not include, certain features, elements, and/or steps. Thus, such conditional language is not generally intended to imply that features, elements and/or steps are in any way required for one or more examples or that one or more examples necessarily include logic for deciding, with or without author input or prompting, whether these features, elements and/or steps are included or are to be performed in any particular example.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Similarly, the use of "based at least in part on" is meant to be open and inclusive, in that a process, step, calculation, or other action "based at least in part on" one or more recited conditions or values may, in practice, be based on additional conditions or values beyond those recited. Headings, lists, and numbering included herein are for ease of explanation only and are not meant to be limiting.

The various features and processes described above may be used independently of one another, or may be combined in various ways. All possible combinations and sub-combinations are intended to fall within the scope of the present disclosure. In addition, certain method or process blocks may be omitted in some embodiments. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed examples. Similarly, the example systems and components described herein may be configured differently than described. For example, elements may be added to, removed from, or rearranged compared to the disclosed examples.

What is claimed is:

1. A computer mouse comprising:
   one or more processors;
   a mechanically depressible input element; and
   an electropermanent magnet (EPM) assembly including:
      a permanent magnet operable to generate a magnetic field; and
      a magnetizing assembly controlled by the one or more processors and configured to set a strength and polarity of the magnetic field generated by the permanent magnet;
   a first ferromagnetic element coupled to the depressible input element;
   a second ferromagnetic element coupled to the EPM assembly,
      wherein the first and second ferromagnetic elements are configured to be at least partially axially aligned and in contact with each other when the depressible input element is in a neutral, non-depressed state,
      wherein the first ferromagnetic element is configured to part and move away from the second ferromagnetic element as the depressible input element is depressed,
      wherein when the EPM assembly magnetizes the permanent magnet to a first polarity, the first and second ferromagnetic elements are magnetically attracted to each other and provide an attracting force in proportion to the strength of the magnetic field that magnetically opposes the first and second ferromagnetic elements from parting, and
      wherein when the EPM assembly magnetizes the permanent magnet to a second polarity, the first and second ferromagnetic elements are not magnetically attracted to each other and do not magnetically oppose the first and second ferromagnetic elements from parting.

2. The computer mouse of claim 1 wherein the input element is flexible and provides a resistance to flexion, and
   wherein when the EPM assembly magnetizes the permanent magnet to the first polarity and the strength of the magnetic field is greater than the resistance to flexion of the input element, a force imparted on the input element that causes the first and second ferromagnetic elements to part includes a force magnitude greater than the resistance to flexion and the attracting force of the first and second ferromagnetic elements.

3. The computer mouse of claim 2 wherein the input element is flexible up to a threshold deflection distance,
   wherein the input element is depressible up to a threshold depression distance, the threshold deflection distance being less than the threshold depression distance,
   wherein when the EPM assembly magnetizes the permanent magnet to the first polarity and the strength of the magnetic field is greater than the resistance to flexion of the input element, the input element is depressible up to the threshold deflection and stops until the force imparted on the input element is greater than the attracting force thereby causing the first and second ferromagnetic elements to part and cause the input element to continue depressing up to the threshold depression distance.

4. The computer mouse of claim 2 wherein the first and second ferromagnetic elements are configured to move apart up to 0.2 mm to 0.5 mm.

5. The computer mouse of claim 2 wherein the threshold deplection distance for the input element is 0.5 mm to 0.7 mm.

6. The computer mouse of claim 1 wherein the input element is a key plate that includes:
   a front user-accessible portion having a top surface and a bottom surface;
   a pivot support portion;
   a rear portion including a bottom surface; and
   a shaft disposed in the pivot support portion, wherein the key plate rotates with respect to the shaft.

7. The computer mouse of claim 6 wherein the EPM assembly, first ferromagnetic element, and second ferromagnetic element are configured on the rear portion of the key plate.

8. The computer mouse of claim 6 wherein the EPM assembly, first ferromagnetic element, and second ferromagnetic element are configured on the front user-accessible portion of the key plate.

9. The computer mouse of claim 1 further comprising:
   a Hall Effect Sensor configured to detect a change in a magnetic flux of the magnetic field of the EPM assembly, wherein the one or more processors are further configured to generate a control signal corresponding to a depression of the input element by a threshold distance when the magnetic flux changes by a threshold amount.

10. The computer mouse of claim 1 wherein the magnetizing assembly includes a magnetic core and polarization coil.

11. The computer mouse of claim 1 wherein when the EPM assembly magnetizes the permanent magnet to the first polarity, a first magnetic circuit is formed that passes through at least the first or second ferromagnetic elements, and
   wherein when the EPM assembly magnetizes the permanent magnet to the second polarity, a second magnetic circuit is formed within the EPM assembly that does not pass through the first and second ferromagnetic elements.

12. The computer mouse of claim 11 wherein when the EPM assembly magnetizes the permanent magnet to the first polarity, the magnetizing assembly and permanent magnet have matching magnetic poles, and
   wherein when the EPM assembly magnetizes the permanent magnet to the second polarity, the magnetizing assembly and permanent magnet have opposing magnetic poles that form a closed magnetic circuit within the EPM assembly.

13. A computer-implemented method comprising:
receiving, by one or more processors, input data indicating a selection of one of a plurality of modes of operation of a computer mouse,
wherein the computer mouse includes:
an input element;
an EPM assembly comprising:
a permanent magnet operable to generate a magnetic field;
a magnetizing assembly configured to set a strength and polarity of the magnetic field generated by the permanent magnet;
a first ferromagnetic element coupled to the input element; and
a second ferromagnetic element coupled to the EPM assembly,
wherein the first and second ferromagnetic elements are configured to be at least partially axially aligned and in contact with each other when the input element is in a neutral, non-depressed state, and
wherein the first ferromagnetic element is configured to part and move away from the second ferromagnetic element as the input element is depressed;
in response to the received input data corresponding to the selection of a first mode of operation of the plurality of modes of operation: magnetizing the permanent magnet to a first polarity such that the first and second ferromagnetic elements are magnetically attracted to each other and provide an attracting force in proportion to the strength of the magnetic field that magnetically opposes the first and second ferromagnetic elements from parting; and
in response to the received input data corresponding to the selection of a second mode of operation of the plurality of modes of operation: magnetizing the permanent magnet to a second polarity such that the first and second ferromagnetic elements are not magnetically attracted to each other and do not magnetically oppose the first and second ferromagnetic elements from parting.

14. The computer-implemented method of claim 13 wherein the input element is flexible and provides a resistance to flexion, and
wherein when the EPM assembly magnetizes the permanent magnet to the first polarity and the strength of the magnetic field is greater than the resistance to flexion of the depressible element, a force imparted on the input element that causes the first and second ferromagnetic elements to part includes a force magnitude greater than the resistance to flexion and the attracting force of the first and second ferromagnetic elements.

15. The computer-implemented method of claim 14 wherein the input element is flexible up to a threshold deflection distance,
wherein the input element is depressible up to a threshold depression distance, the threshold deflection distance being less than the threshold depression distance, and
wherein when the EPM assembly magnetizes the permanent magnet to the first polarity and the strength of the magnetic field is greater than the resistance to flexion of the depressible element, the input element is depressible up to the threshold deflection and stops until the force imparted on the input element is greater than the attracting force thereby causing the first and second ferromagnetic elements to part and cause the depressible element to continue depressing up to the threshold depression distance.

16. The computer-implemented method of claim 13 wherein the input element is a key plate that includes:
a front user-accessible portion having a top surface and a bottom surface;
a pivot support portion;
a rear portion including a bottom surface; and
a shaft disposed in the pivot support portion, wherein the key plate rotates with respect to the shaft.

17. The computer-implemented method of claim 16 wherein the EPM assembly, first ferromagnetic element, and second ferromagnetic element are configured on:
the rear portion of the key plate; or
on the front user-accessible portion of the key plate.

* * * * *